(12) United States Patent
Oganesian

(10) Patent No.: US 9,524,917 B2
(45) Date of Patent: Dec. 20, 2016

(54) CHIP LEVEL HEAT DISSIPATION USING SILICON

(71) Applicant: Optiz, Inc., Palo Alto, CA (US)

(72) Inventor: Vage Oganesian, Sunnyvale, CA (US)

(73) Assignee: OPTIZ, INC., Palo Alto, CA (US)

( * ) Notice: Subject to any disclaimer, the term of this patent is extended or adjusted under 35 U.S.C. 154(b) by 0 days.

(21) Appl. No.: 14/662,088

(22) Filed: Mar. 18, 2015

(65) Prior Publication Data

US 2015/0311137 A1 Oct. 29, 2015

Related U.S. Application Data

(60) Provisional application No. 61/983,402, filed on Apr. 23, 2014.

(51) Int. Cl.
| | | |
|---|---|---|
| *H01L 23/48* | (2006.01) | |
| *H01L 23/367* | (2006.01) | |
| *H01L 23/373* | (2006.01) | |
| *H01L 21/48* | (2006.01) | |

(52) U.S. Cl.
CPC ....... *H01L 23/3675* (2013.01); *H01L 21/4871* (2013.01); *H01L 23/3672* (2013.01); *H01L 23/3677* (2013.01); *H01L 23/3738* (2013.01); *H01L 2924/0002* (2013.01)

(58) Field of Classification Search
USPC ... 257/433, 432, 444, 706, 712, 713; 438/64
See application file for complete search history.

(56) References Cited

U.S. PATENT DOCUMENTS

| | | |
|---|---|---|
| 5,151,777 A | 9/1992 | Akin et al. |
| 5,403,783 A | 4/1995 | Nakanishi et al. |
| 6,627,864 B1 | 9/2003 | Glenn |
| 6,777,767 B2 | 8/2004 | Badehi |
| 6,972,480 B2 | 12/2005 | Zilber et al. |
| 7,033,664 B2 | 4/2006 | Zilber et al. |
| 7,157,742 B2 | 1/2007 | Badehi |
| 7,192,796 B2 | 3/2007 | Zilber et al. |
| 7,265,440 B2 | 9/2007 | Zilber et al. |
| 7,325,593 B2 | 2/2008 | Kujirai |
| 7,456,901 B2 | 11/2008 | Jeong et al. |
| 7,495,341 B2 | 2/2009 | Zilber et al. |
| 7,569,409 B2 | 8/2009 | Lin et al. |

(Continued)

FOREIGN PATENT DOCUMENTS

| | | |
|---|---|---|
| JP | 02-283053 | 11/1990 |
| JP | 06-252300 | 9/1994 |

(Continued)

OTHER PUBLICATIONS

U.S. Appl. No. 13/157,193, filed Jun. 9, 2011, Oganesian, Vage.

(Continued)

*Primary Examiner* — Alexander Oscar Williams
(74) *Attorney, Agent, or Firm* — DLA Piper LLP (US)

(57) ABSTRACT

A semiconductor device that includes a semiconductor chip having a first silicon substrate with opposing first and second surfaces, a semiconductor device formed at or in the first surface, a plurality of first contact pads formed at the first surface which are electrically coupled to the semiconductor device, a layer of thermal conductive material on the second surface, and a plurality of first vias formed partially through the layer of thermal conductive material.

15 Claims, 38 Drawing Sheets

(56) References Cited

U.S. PATENT DOCUMENTS

| | | |
|---|---|---|
| 7,589,422 B2 | 9/2009 | Lee et al. |
| 7,642,629 B2 | 1/2010 | Zilber et al. |
| 7,664,390 B2 | 2/2010 | Cho et al. |
| 7,859,033 B2 | 12/2010 | Brady |
| 8,164,177 B2 * | 4/2012 | Matz .................. H01L 23/3735 257/703 |
| 8,183,579 B2 * | 5/2012 | Wang ..................... H01L 33/62 257/698 |
| 8,432,011 B1 | 4/2013 | Oganesian |
| 8,520,388 B2 | 8/2013 | Kurosawa |
| 8,564,114 B1 | 10/2013 | Lanzone |
| 2004/0104021 A1 | 6/2004 | Kujirai et al. |
| 2004/0251525 A1 | 12/2004 | Zilber |
| 2005/0051859 A1 | 3/2005 | Hoffman |
| 2005/0104179 A1 | 5/2005 | Zilber |
| 2005/0104186 A1 | 5/2005 | Yang |
| 2005/0205977 A1 | 9/2005 | Zilber |
| 2007/0138498 A1 | 6/2007 | Zilber |
| 2007/0190691 A1 | 8/2007 | Humpston |
| 2007/0190747 A1 | 8/2007 | Humpston |
| 2007/0205792 A1 * | 9/2007 | Mouli .................. H01L 23/367 324/750.09 |
| 2008/0012115 A1 | 1/2008 | Zilber |
| 2008/0017879 A1 | 1/2008 | Zilber |
| 2008/0083976 A1 | 4/2008 | Haba |
| 2008/0083977 A1 | 4/2008 | Haba |
| 2008/0099900 A1 | 5/2008 | Oganesian |
| 2008/0099907 A1 | 5/2008 | Oganesian |
| 2008/0116544 A1 * | 5/2008 | Grinman ............. H01L 23/3114 257/659 |
| 2008/0116545 A1 | 5/2008 | Grinman |
| 2008/0150121 A1 | 6/2008 | Oganesian |
| 2008/0224249 A1 * | 9/2008 | Nabe ................. H01L 27/14618 257/433 |
| 2008/0246136 A1 | 10/2008 | Haba |
| 2008/0265350 A1 | 10/2008 | Wu et al. |
| 2009/0115047 A1 | 5/2009 | Haba |
| 2009/0160065 A1 | 6/2009 | Haba |
| 2009/0212381 A1 | 8/2009 | Crisp |
| 2010/0053407 A1 | 3/2010 | Crisp |
| 2010/0164093 A1 * | 7/2010 | Mowry ............... H01L 23/3677 257/706 |
| 2010/0225006 A1 | 9/2010 | Haba |
| 2010/0230148 A1 * | 9/2010 | Kariya ................... H01L 23/13 174/258 |
| 2010/0230812 A1 | 9/2010 | Oganesian |
| 2010/0237452 A1 | 9/2010 | Hagiwara et al. |
| 2010/0276701 A1 | 11/2010 | Hebert et al. |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0108940 A1 | 5/2011 | Huang et al. |
| 2011/0149537 A1 | 6/2011 | Kurosawa |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0043635 A1 | 2/2012 | Yang |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |
| 2012/0097245 A1 * | 4/2012 | Nishina ................ H01L 31/048 136/256 |
| 2012/0182693 A1 * | 7/2012 | Boday ..................... C09K 5/14 361/713 |
| 2012/0217628 A1 * | 8/2012 | Chou .................. H01L 23/3677 257/692 |
| 2013/0280864 A1 | 10/2013 | Bachman |
| 2015/0084148 A1 * | 3/2015 | Oganesian ........ H01L 27/14618 257/433 |

FOREIGN PATENT DOCUMENTS

| | | |
|---|---|---|
| JP | 06-268110 | 9/1994 |
| JP | 2003-258165 | 9/2003 |
| JP | 2004-134480 | 4/2004 |
| JP | 2006-245560 | 9/2006 |
| JP | 2007-242864 | 9/2007 |
| JP | 2010-239018 | 10/2010 |
| JP | 2011-134769 | 7/2011 |
| JP | 2012-164956 | 8/2012 |
| JP | 2013-098212 | 5/2013 |
| WO | 02076163 | 9/2002 |

OTHER PUBLICATIONS

U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.
U.S. Appl. No. 13/312,826, filed Dec. 2011, Oganesian.

* cited by examiner

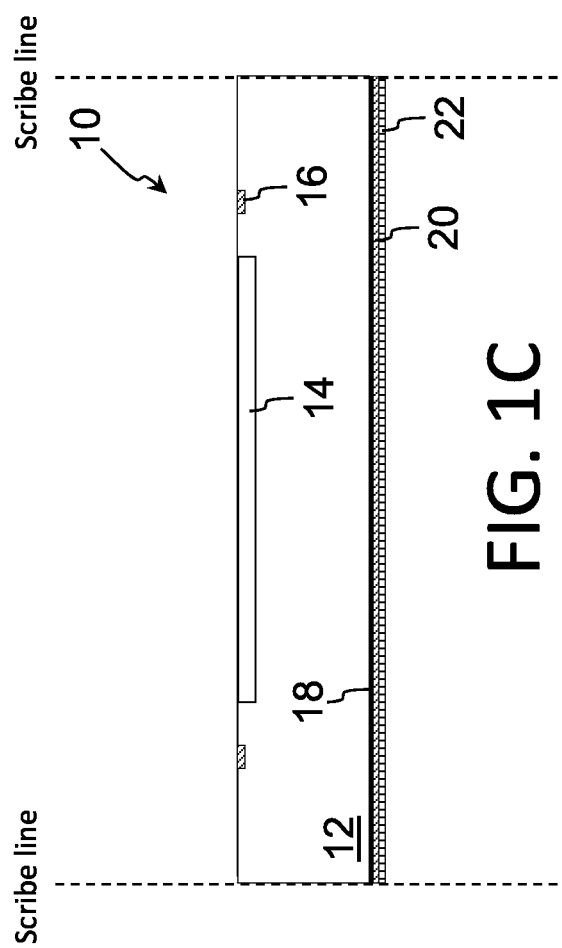

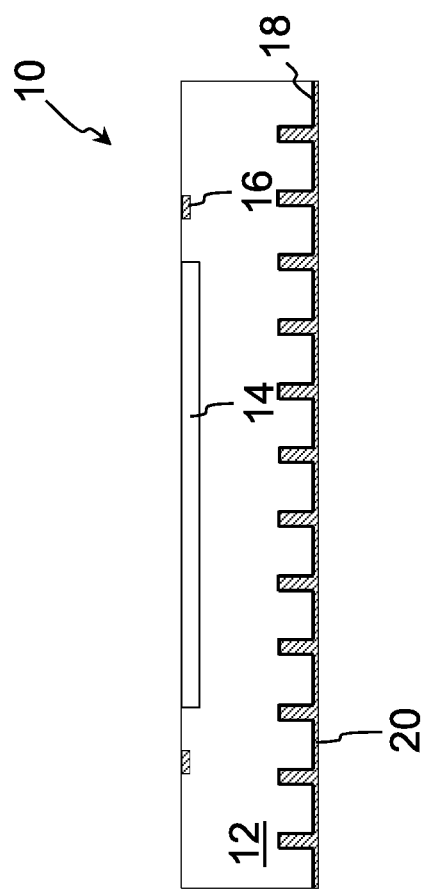

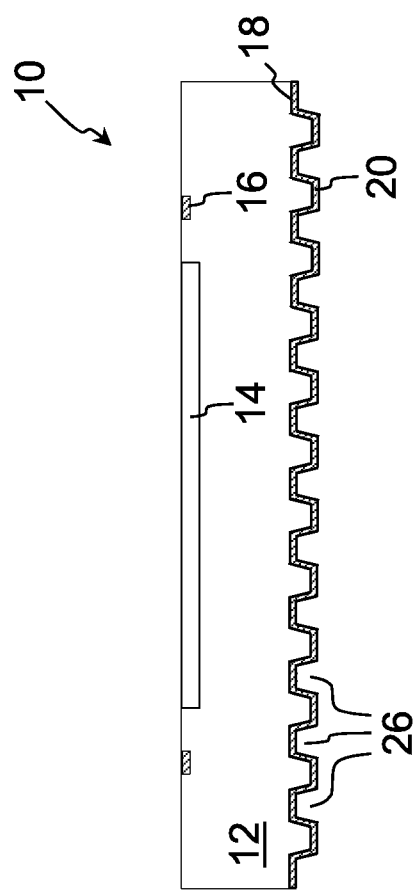

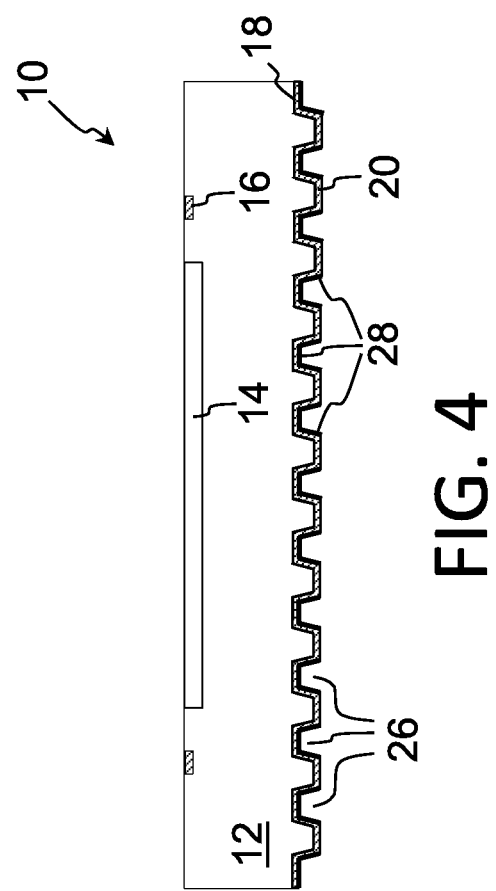

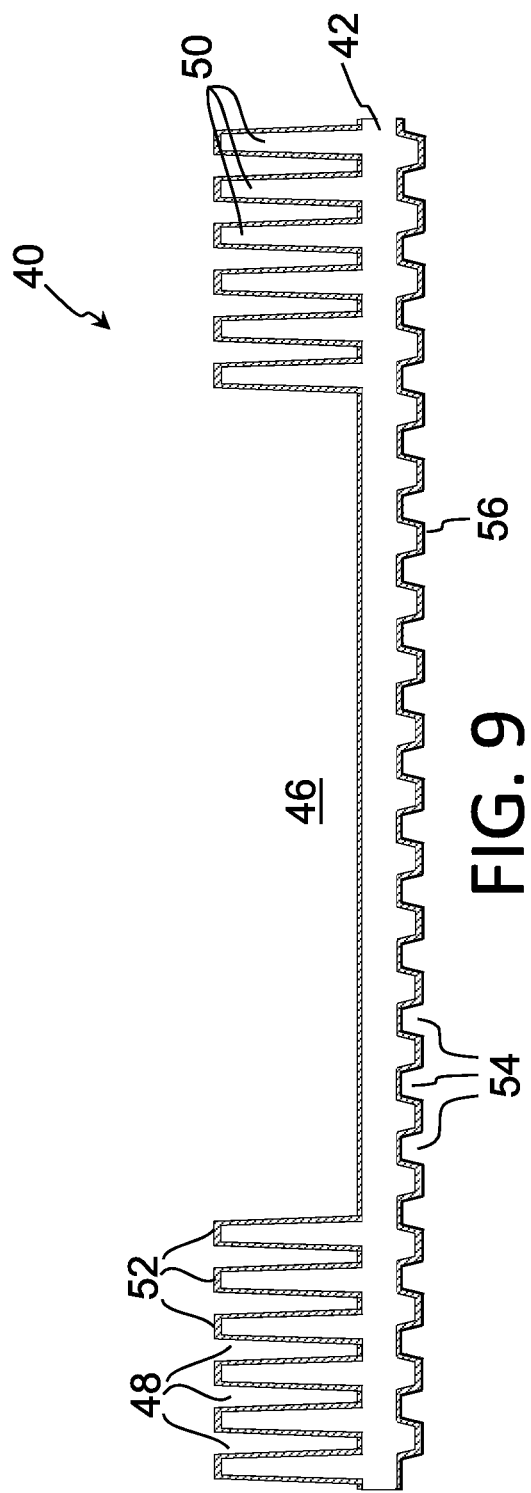

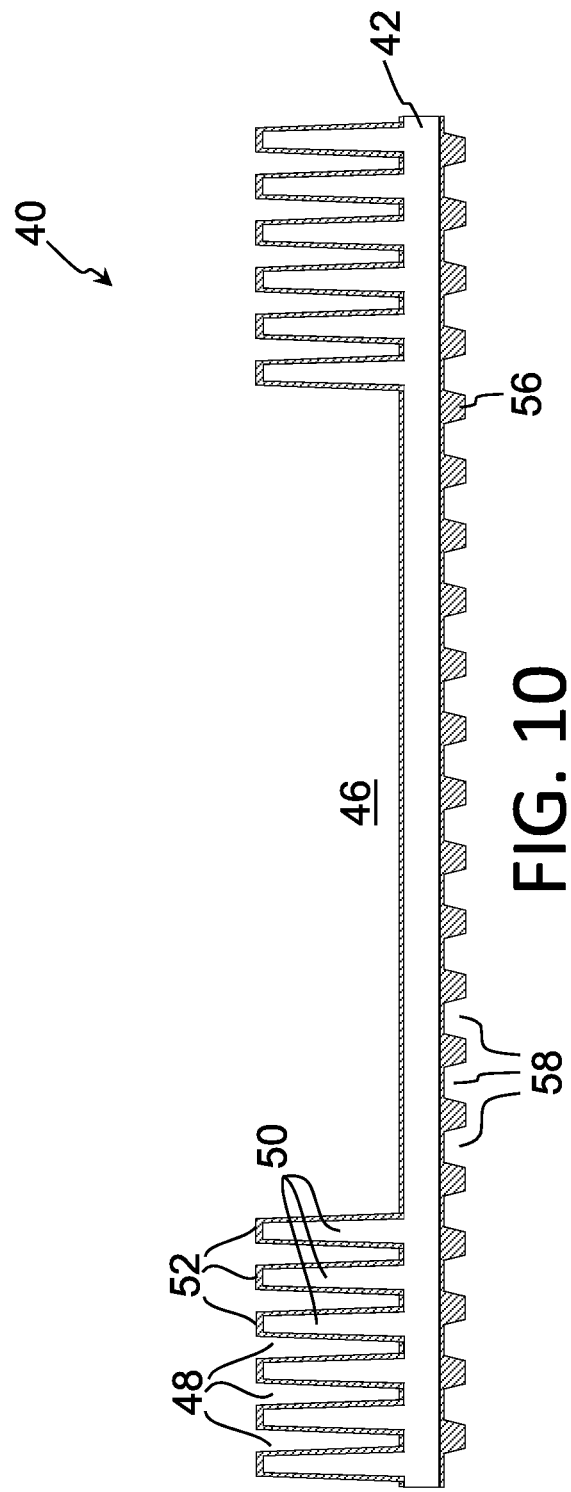

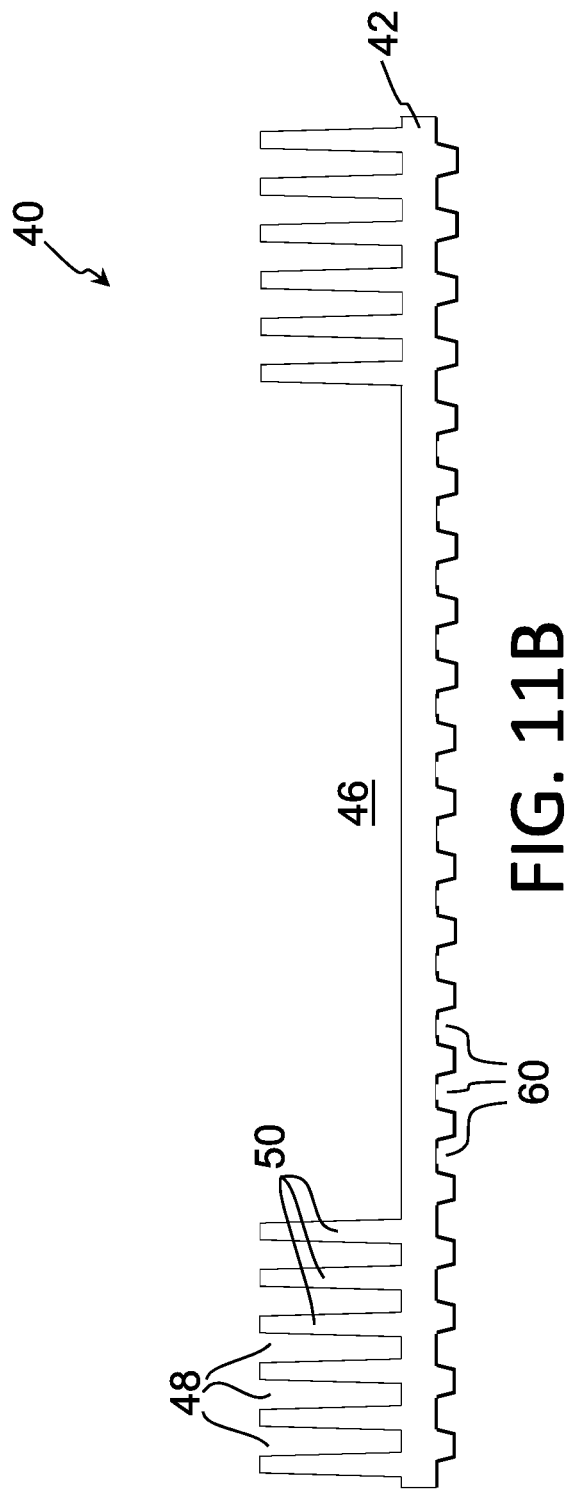

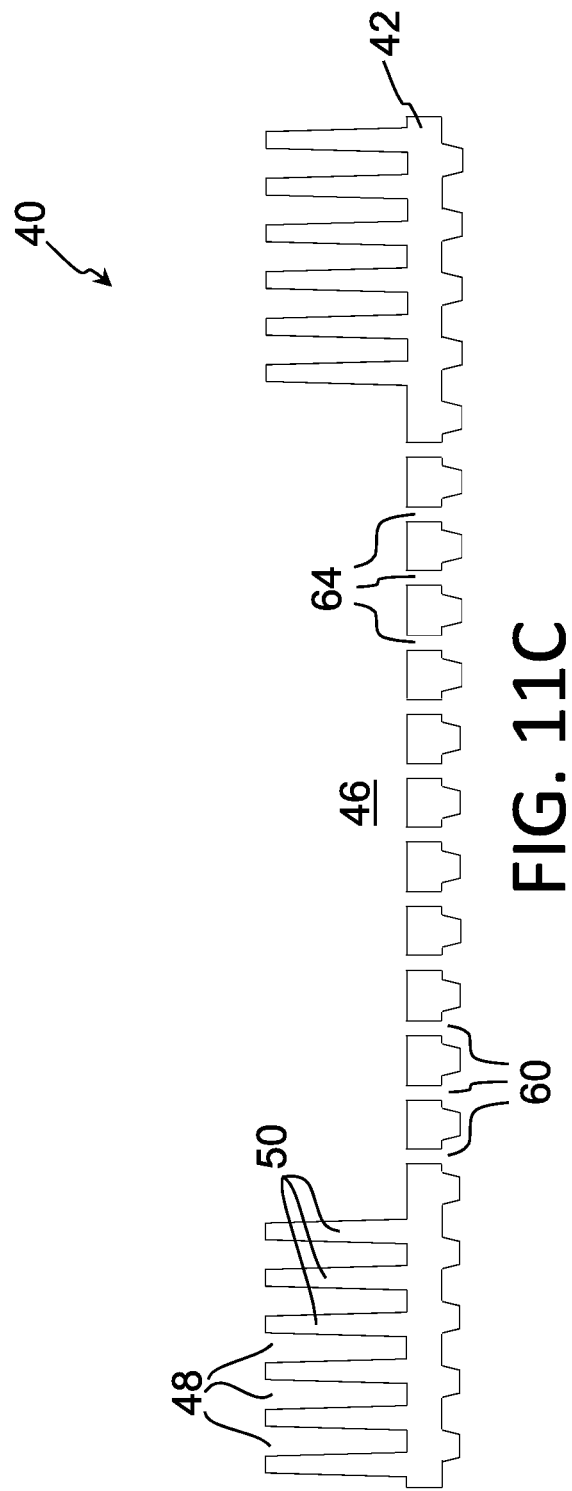

CHIP LEVEL HEAT DISSIPATION USING SILICON

RELATED APPLICATIONS

This application claims the benefit of U.S. Provisional Application No. 61/983,402, filed Apr. 23, 2014, and which is incorporated herein by reference.

FIELD OF THE INVENTION

The present invention relates to cooling of semiconductor devices.

BACKGROUND OF THE INVENTION

Mobile semiconductors in the recent years have experienced a huge growth in both processing power and heat generation. Currently, cooling solutions for mobile semiconductors are in their infancy. While there are many robust semiconductor cooling solutions on the market, they are not designed for mobile devices and are very much outdated. The current cooling solutions can be summed up as too heavy, too large, not efficient, wasteful of material and in some cases consume too much power. Therefore, a miniature, light weight, low profile, efficient, passive and high performance modern mobile heat sink configuration is needed.

It is known in the art to mount a heat sink over a semiconductor package. See for example U.S. Pat. No. 8,564,114. After the semiconductor chip is packaged, a large metallic heat sink is attached over the semiconductor chip. The heat sink is generally constructed using copper and/or aluminum and incorporates arrays of heat exchangers. It is very typical to use some type of high K Thermal Interface Material (TIM) in-between the heat sink and the semiconductor chip. The TIM in general has a K value of around 9. However, it is also known to use solder as the TIM to increase the thermal conductivity. Solder has a K value of 50, and can be mixed with copper and/or silver to increase the K value up to around 80. This solution, however, is not conducive for mobile applications, where there is a need to minimize size, weight, inefficiency, material used, and power consumption in the heat dissipation solution.

BRIEF SUMMARY OF THE INVENTION

The aforementioned problems and needs are addressed by a semiconductor device that includes a semiconductor chip having a first silicon substrate with opposing first and second surfaces, a semiconductor device formed at or in the first surface, a plurality of first contact pads formed at the first surface which are electrically coupled to the semiconductor device, a layer of thermal conductive material on the second surface, and a plurality of first vias formed partially through the layer of thermal conductive material.

Other objects and features of the present invention will become apparent by a review of the specification, claims and appended figures.

BRIEF DESCRIPTION OF THE DRAWINGS

FIGS. 1A-1C are side cross sectional views showing the formation of the semiconductor chip with cooling features.

FIGS. 2A-2C are side cross sectional views showing the formation of an alternate embodiment of the semiconductor chip with cooling features.

FIG. 3 is a side cross sectional view of an alternate embodiment of the semiconductor chip with cooling features.

FIG. 4 is a side cross sectional view of an alternate embodiment of the semiconductor chip with cooling features.

FIG. 9 is a side cross sectional view of an alternate embodiment of the heat sink with cooling features.

FIG. 10 is a side cross sectional view of an alternate embodiment of the heat sink with cooling features.

FIGS. 11A-11D are side cross sectional views showing the formation of an alternate embodiment of the heat sink with cooling features.

DETAILED DESCRIPTION OF THE INVENTION

The present invention includes techniques and configurations for forming cooling features directly in the silicon semiconductor substrate on which the integrated circuits are formed, alone or in combination with a silicon heat sink.

Figure 1A:
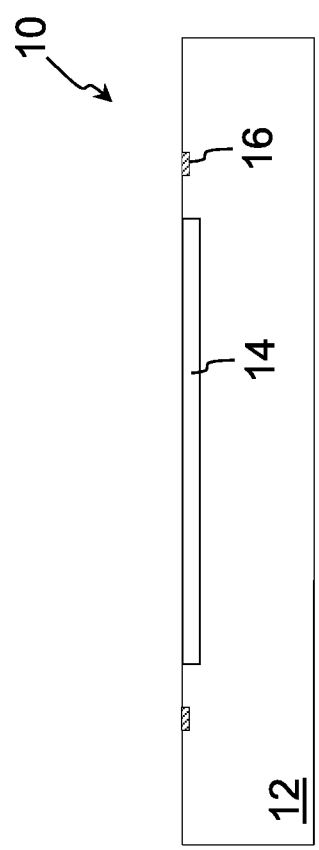
Figure 1B:
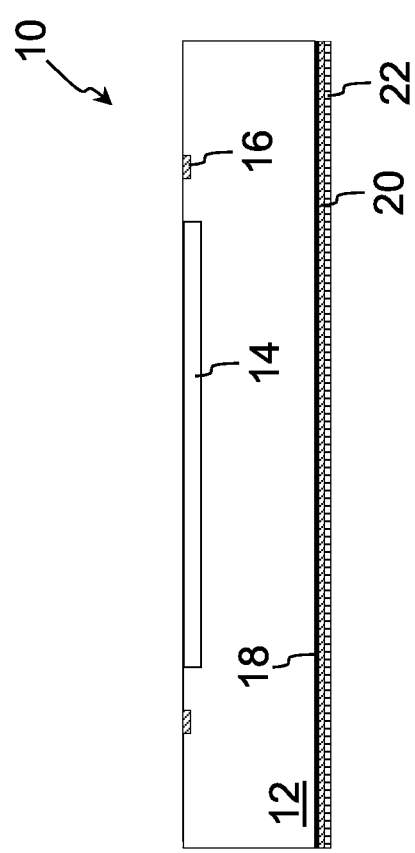

FIGS. 1A-1C illustrate the formation of a silicon semiconductor device with a cooling feature according to a first embodiment that features a thermal conductive layer on the backside of the semiconductor chip. This layer allows high thermal conductivity across the semiconductor chip. Such a layer can reduce hot spots in the semiconductor chip and increase the thermal dissipation rate (e.g., thermal conduction and emission). FIG. 1A shows a generic semiconductor chip 10 that includes a silicon substrate 12, one or more semiconductor devices 14 formed on or in the top surface of the substrate 12, and bond pads 16 formed on the top surface of substrate 12 which are electrically coupled to the semiconductor device(s) 14 for off-chip connectivity. While FIG. 1A shows only a single semiconductor device 14 with its associated bond pads 16, it should be understood that a plurality of such devices are formed on a single wafer and later singulated into individual device die.

A passivation layer 18 is deposited on the bottom surface of the semiconductor substrate 12. This passivation layer acts as a diffusion barrier for the semiconductor chip 10. The passivation layer 18 can be deposited by a sputtering process that is well known in the art. A preferred thickness of the passivation layer 18 is 0.1 µm or less. A preferred passivation material would have high thermal conductivity, such as tungsten, nickel, chromium and alloys of aforementioned materials or any other appropriate passivation materials that are well known in the art. A layer of material 20 with high thermal conductivity is deposited over the passivation layer 18. The thermal conductive layer 20 enhances thermal conductivity across the semiconductor chip, thus reducing hot spots. Material such as copper, silver, graphene, carbon related materials or any other well-known thermally conductive materials can be used. Deposition can be performed by Physical Vapor Deposition (PVD) or any other appropriate process for the material of choice. A separate bonding layer 22 can be applied if the thermal conductive layer 20 cannot double as a bonding layer. Metal to metal bonding is preferred for its thermal conductivity characteristic. If copper is used, then a traditional copper to copper bonding through a thermal compression bonding process can be used. If silver or indium is used, then a silver indium room temperature weld process can be used. The resulting structure is shown in FIG. 1B.

Wafer level dicing/singulation of the semiconductor chip can be done at scribe lines between the individual semiconductor devices 14 and their associated bond pads 16 with mechanical blade dicing equipment, laser cutting or any other appropriate processes. The final die structure is shown in FIG. 1C.

Figure 2A:
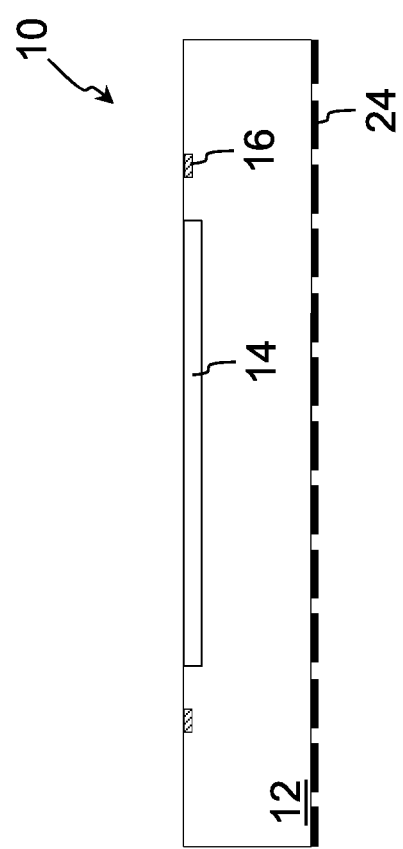
Figure 2B:
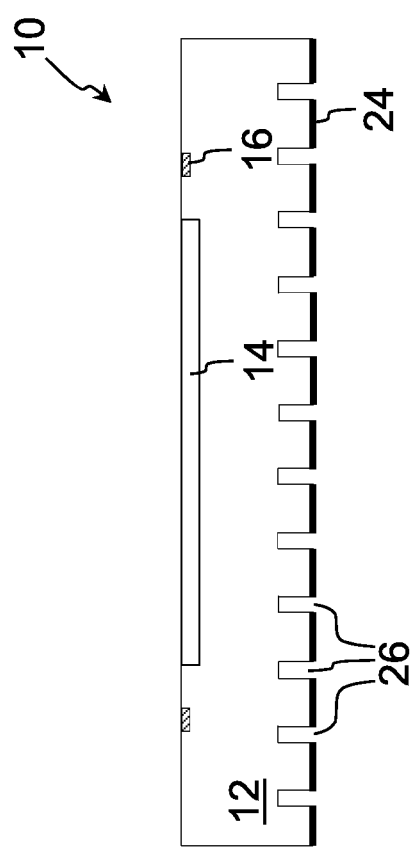

FIGS. 2A-2C illustrate the formation of an alternate embodiment of semiconductor chip 10, where in addition to the thermal conductive layer 20, thermal vias are formed into the bottom surface of substrate 12, thus increasing the overall contact surface of the substrate 12 with the thermal conductive layer 20, and reaching deeper into the semiconductor substrate 12 for enhanced heat extraction. The thermal vias can be filled with the thermal conductive layer material. The process begins with the semiconductor chip of FIG. 1A. A layer of photoresist 24 is deposited on the bottom surface of the semiconductor substrate 12. Photoresist 24 is exposed and selectively etched using a photolithographic process to leave a pattern in the photoresist that selectively exposes the underlying bottom surface of substrate 12. The pattern in the photoresist can be random or pseudo-random. The resulting structure is shown in FIG. 2A.

The exposed bottom surface portions of substrate 12 are etched through the openings in the photoresist 24 to form vias 26 (i.e. holes, slots, trenches, channels, or any other form of cavities or cavity pattern) into the bottom surface of the substrate 12. A dry etch is preferred for the etching process. The opposing walls of each via can be perpendicular or tapered. The depth, width, shape and location of the vias 26 can be random or pseudo-random. The resulting structure (with perpendicular via sidewalls) is shown in FIG. 2B.

After the photo resist 24 is removed, passivation layer 18 is deposited on the back surface of the semiconductor substrate 12 as described above. Then, thermal conductive layer 20 is deposited over the passivation layer 18 as described above. The vias 26 are either filled or coated with the thermal conductive layer 20 material. The substrate 12 is then singulated as described above, with the final structure shown in FIG. 2C. In FIG. 2C, the vias 26 are filled with the thermal conductive layer material 20, and have perpendicular sidewalls. In contrast, FIG. 3 illustrates an alternative embodiment where the vias 26 are coated but not filled with the thermal conductive layer 20, and have tapered sidewalls.

In any of the embodiments herein, an optional thermal emissivity enhancement layer 28 can be selectively deposited randomly or pseudo-randomly over the thermal conductive layer except for the bonding area. One example is shown in FIG. 4. Alternatively, the bonding area can be coated with the thermal emissivity enhancement layer 28 which can be optionally removed using chemical or mechanical processes to expose the bonding area. The purpose of layer 28 is to enhance the thermal emissivity of the chip by using a very high thermal emissive material that is also oxidization resistant, as discussed further below. Materials such as copper nickel alloy, gold or any other high thermal emissive and oxidization resistant material are ideal. The deposition method can be Physical Vapor Deposition (PVD) or any other appropriate process for the material of choice. Finally, the surface can be optionally, selectively chemically polished to enhance thermal emissivity.

Figure 5A:
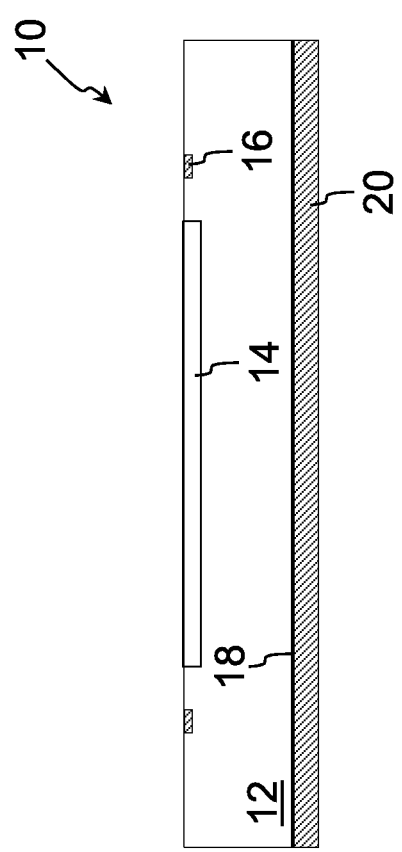
FIGS. 5A-5C are side cross sectional views showing the formation of an alternate embodiment of the semiconductor chip with cooling features.
Figure 5B:
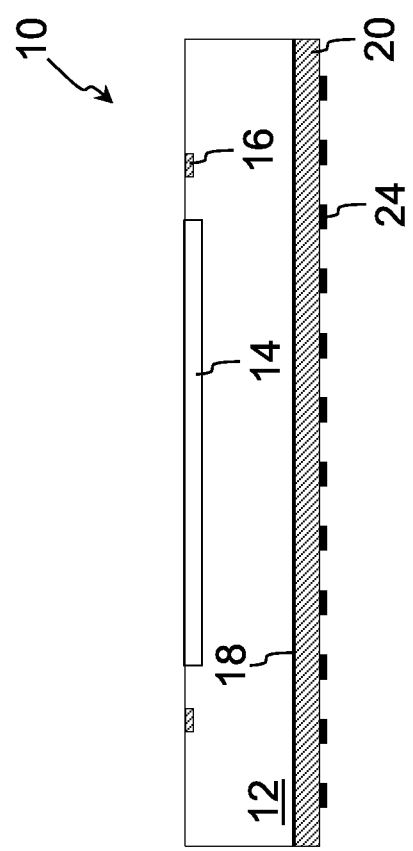
Figure 5C:
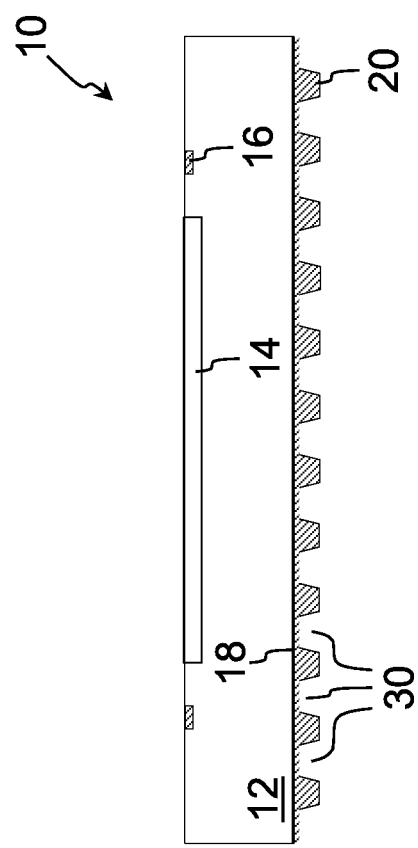

FIGS. 5A-5C illustrate the formation of another alternate embodiment, where the thermal conductivity layer is formed on the semiconductor substrate bottom surface, and vias are formed into the thermal conductive layer, which provides additional heat exchange surfaces therein. The passivation and thermal conductive layers 18 and 20 are formed as discussed above with respect to FIG. 1B. However, the thickness of thermal conductive layer 20 is greater, as shown in FIG. 5A.

A layer of photoresist 24 is deposited on the thermal conductive layer 20. Photoresist 24 is exposed and selectively etched using a photolithographic process to leave a pattern in the photoresist that selectively exposes the underlying thermal conductive layer 20. The pattern in the photoresist can be random or pseudo-random. The resulting structure is shown in FIG. 5B.

The exposed portions of the thermal conductive layer 20 are etched through the openings in the photoresist 24 to form vias 30 (i.e. holes, slots, trenches, channels, or any other form of cavities or cavity pattern) into the thermal conductive layer 20. A dry etch is preferred for the etching process. The via walls are preferably tapered for better air flow. The depth, width, shape and location of the vias can be random or pseudo-random. Preferably, but not necessarily, the vias 30 do not extend all the way through the thermal conductive layer 20 to expose the passivation layer 18 or substrate 12. As stated above, an optional thermal emissivity enhancement layer 28 can be selectively deposited on the thermal conductive layer 20 except for bonding areas. The final structure (after photoresist 24 is removed) is shown in FIG. 5C.

Figure 6:
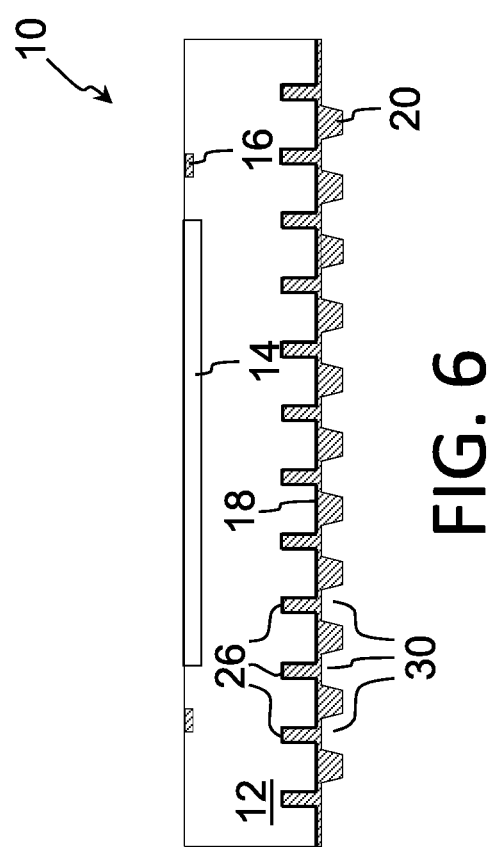
FIG. 6 is a side cross sectional view of an alternate embodiment of the semiconductor chip with cooling features.

FIG. 6 illustrates another alternate embodiment, which combines the vias 26 formed into the bottom surface of the substrate 12 as described above with respect to FIGS. 2A-2C, and the vias 30 formed into the thermal conductive layer 20 as described above with respect to FIGS. 5A-5C. The vias 30 in the thermal conductive layer 20 can be, but need not be, disposed over and aligned with vias 26 in the substrate 12. Formation of the configuration in FIG. 6 can start with the structure in FIG. 2C (but with a thicker thermal conductive layer), and processing continues as described above with respect to FIGS. 5A-5C.

Figure 7:
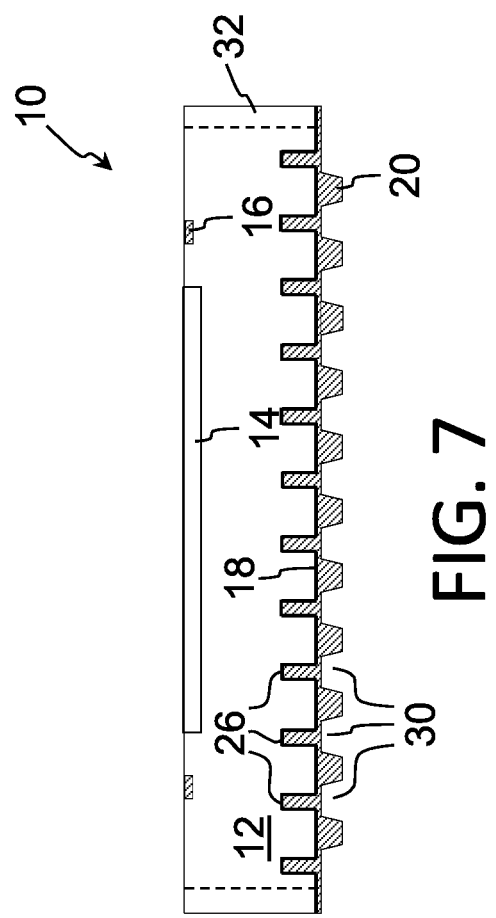
FIG. 7 is a side cross sectional view of an alternate embodiment of the semiconductor chip with cooling features.

FIG. 7 illustrates the chip of FIG. 6, but with the addition of side surface vias 32. After singulation, vias 32 are formed into the side surfaces of the singulated die by a photolithography and etch process. The side vias 32 act as addition heat exchangers. The side vias can be coated with the passivation layer 18, and/or coated or filled with the thermal conductive layer 20 and optionally the thermal emissivity enhancement layer 28. Side surface vias 32 can be incorporated into any of the embodiments described herein.

For effective heat dissipation (e.g., thermal conduction and emission), it is preferable (but not necessarily required) to mount any of the above described semiconductor chips on a silicon-based heat sink. Various embodiments of silicon heat sinks are described below, which can be used with any of the above described chip configurations, or with any other semiconductor chip structure needing effective heat dissipation.

Figure 8A:
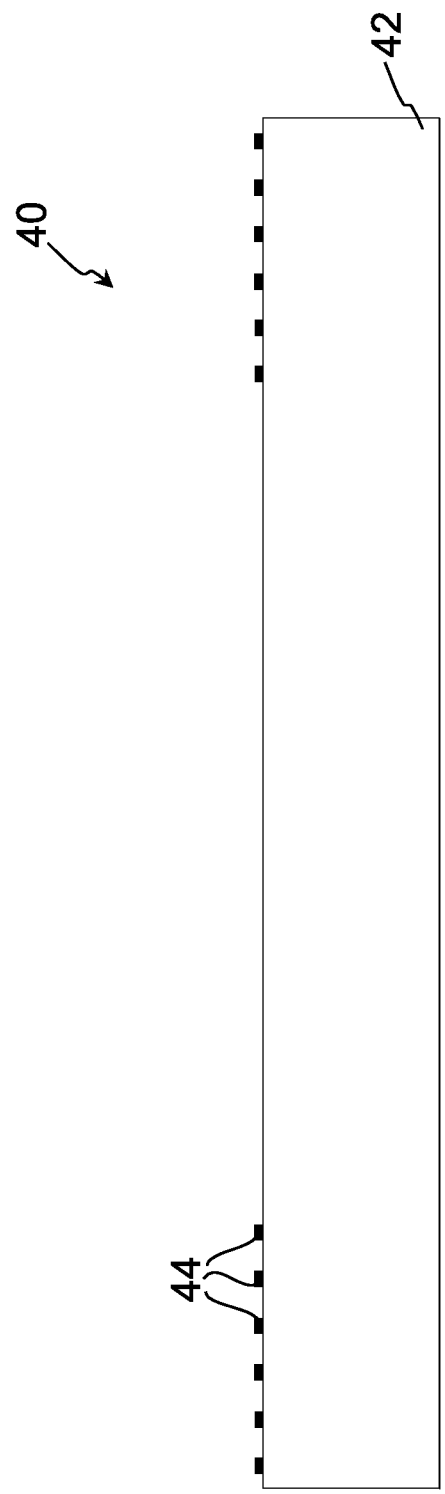
FIGS. 8A-8E are side cross sectional views showing the formation of the heat sink with cooling features.

FIGS. 8A-8E illustrate the formation of a silicon heat sink 40, which starts with a silicon substrate 42. A layer of photoresist 44 is deposited on the top surface of the silicon substrate 42. Photoresist 44 is exposed and etched using appropriate photolithography processes to leave a central area of the top substrate surface exposed, along with smaller adjacent top surface areas exposed as well, as shown in FIG. 8A.

Figure 8B:
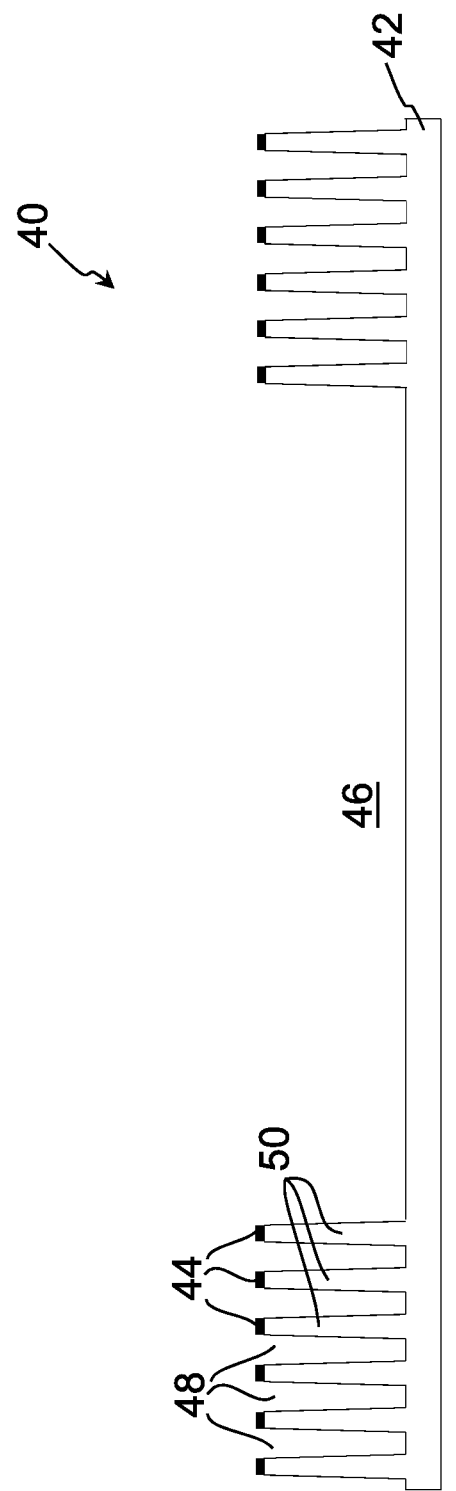

The exposed silicon substrate surface is etched to form a cavity 46 and a plurality of deep trenches, channels, holes or other cavity type voids 48 into the top surface of substrate 42. A dry etch is preferred for the etching process. The depth, width, shape and location of the cavity 46 and trenches 48 can be random or pseudo-random. The trenches 48 define cooling fins 50 of the substrate 42. The walls of the trenches 48 are preferably tapered for better air flow. The resulting structure is shown in FIG. 8B.

Figure 8C:
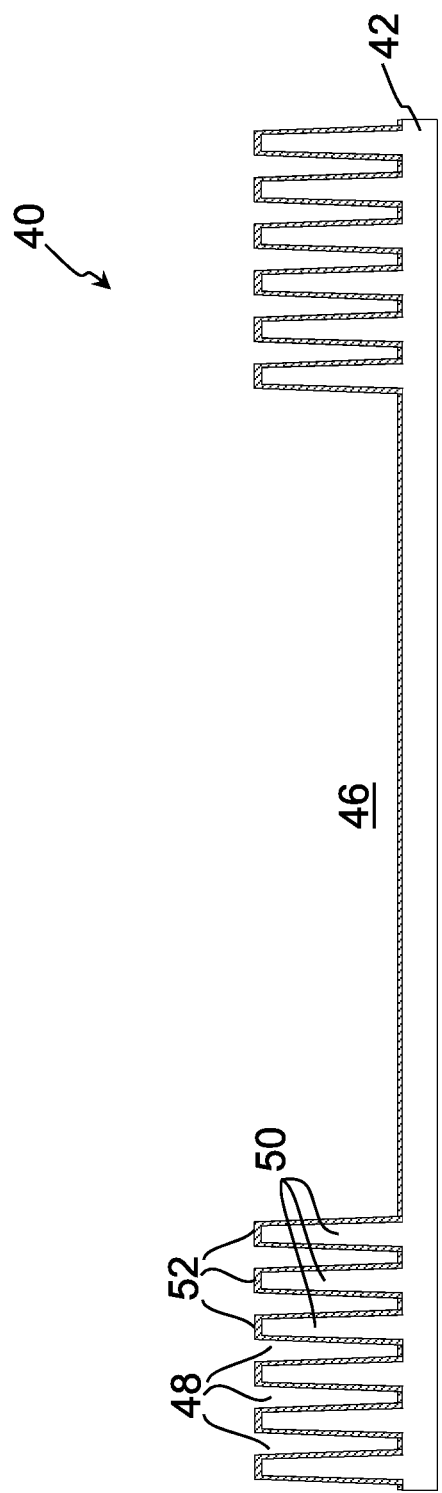

After photo resist 44 is removed, a thermally conductive layer 52 is deposited on the top surface of the substrate 42, including inside cavity 46 and trenches 48. Optionally, this layer can be deposited on the bottom surface of the substrate 42 as well. The purpose of layer 52 is to enhance thermal conductivity across the heat sink, thus increasing heat dissipation capabilities. Materials such as copper, silver, graphene, carbon related materials or any other well-known thermal conductive material can be used. Deposition can be by Physical Vapor Deposition (PVD) or any other appropriate process for the material of choice. A bonding layer can be applied separately if the thermal conductive layer 52 cannot double as bonding layer. Metal to metal bonding is preferred for its thermal conductivity characteristic. If copper is used, then a traditional copper to copper bonding through thermal compression bonding process can be used. If silver or indium is used, then a silver indium room temperature weld process can be used. The resulting structure is shown in FIG. 8C.

A thermal emissivity enhancement layer as described above with respect to the semiconductor chip 10 can be optionally and selectively deposited randomly or pseudo-randomly anywhere on the heat sink 40 except for the bonding area. The thermal emissivity enhancement material can be deposited directly on the silicon substrate 42 or on the thermal conductive layer 52. The final heat sink surface can be optionally, selectively chemically polished to enhance thermal emissivity. Preferably, a plurality of heat sinks 40 are formed simultaneously on a single substrate 42, which then requires singulation of the substrate 42 along scribe lines to result in individual and separate heat sinks 40, as shown in FIG. 8D.

Either before or after singulation, a semiconductor device is mounted inside cavity 46, where heat is conducted from the device, through substrate 42 and thermal conductive layer 52, and off substrate 42 by cooling fins 50. As an example, FIG. 8E shows the chip 10 of FIG. 6 mounted into the cavity 46 of heat sink 40. Heat sink 40 features a monolithic silicon heat sink structure, which includes a silicon substrate, a silicon heat exchanger (i.e. deep trenches formed into the substrate), a thermal conductive bonding interface inside the cavity in which the semiconductor chip mounts, enhanced thermal coatings, and a snug integration of the heat sink and the semiconductor chip mounted thereto. This structure enables optimal semiconductor chip heat dissipation on a miniature scale.

Figure 8D:
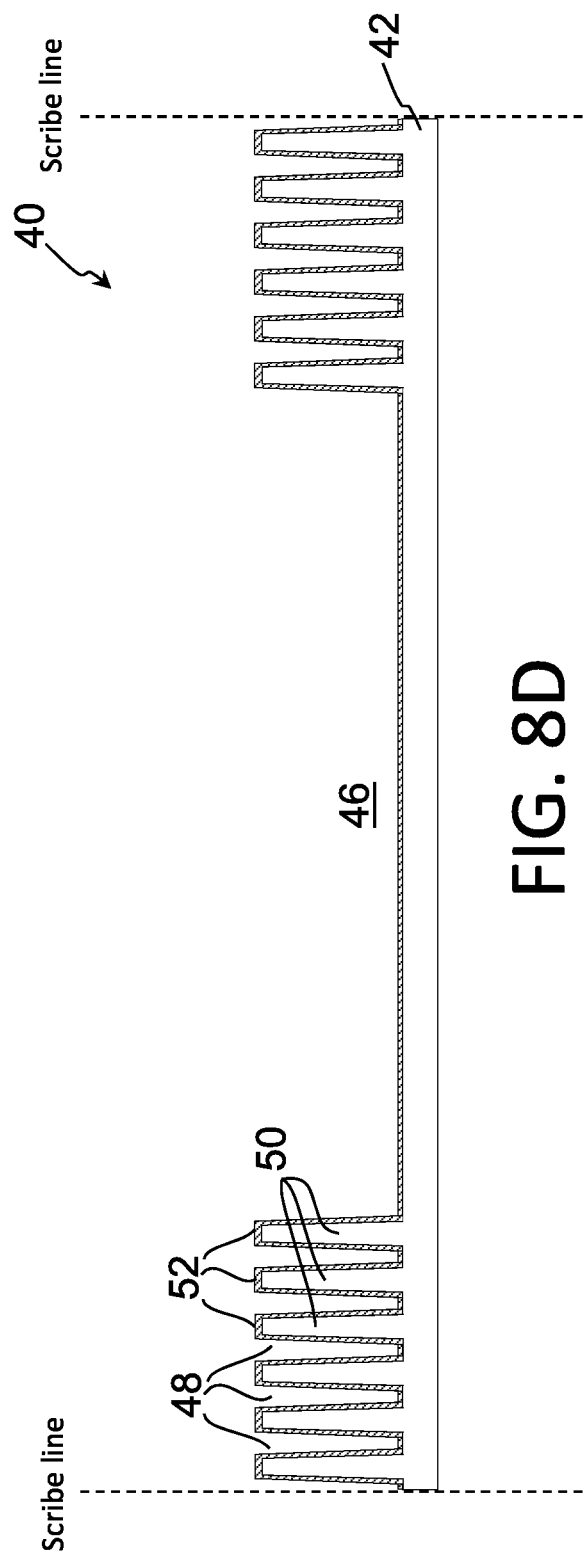
Figure 8E:
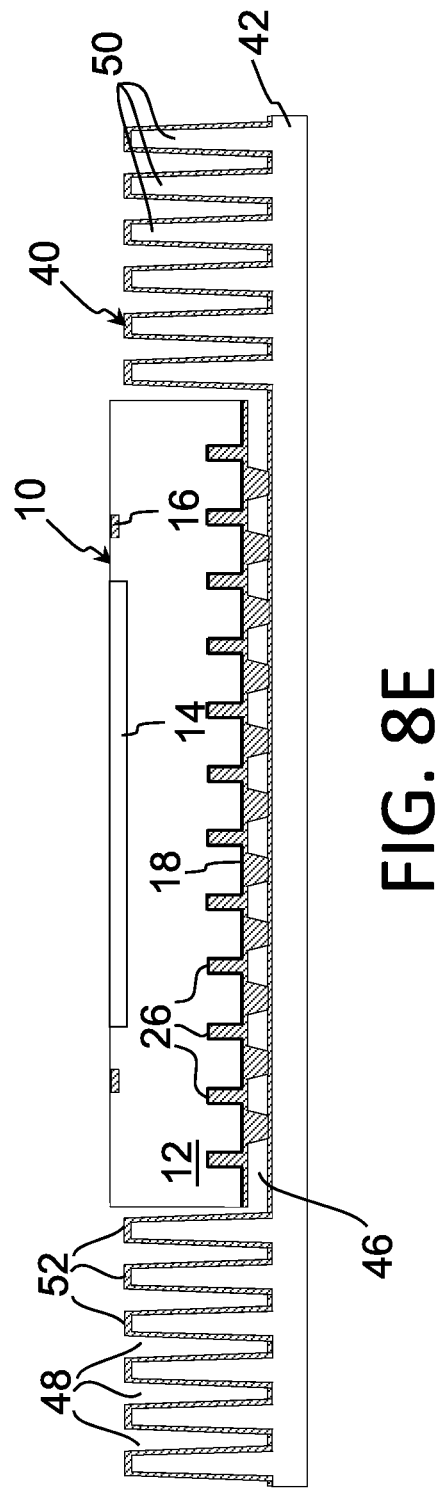

FIG. 9 illustrates an alternate embodiment of the heat sink 40 of FIG. 8D, where heat exchange features are formed on the bottom surface of substrate 42 for additional heat dissipation. Specifically, tapered vias 54 are formed into the bottom surface of substrate 42, and coated (i.e. lined) with a thermal conductive layer 56, in the same manner as discussed above with respect to vias 26 and thermal conductive layer 20 formed into the bottom surface of substrate 12 in FIG. 3.

FIG. 10 illustrates an alternate embodiment of the heat sink 40 of FIG. 9, where heat exchange features are formed into a thermal conductive layer disposed on the bottom surface of substrate 42 for additional heat dissipation. Specifically, a thicker thermal conductive layer 56 is formed on the bottom surface of the substrate 42, and tapered vias 58 are formed into the thermal conductive layer 56, in the same manner as discussed above with respect to vias 30 formed into thermal conductive layer 20 on the bottom surface of substrate 12 in FIG. 5C.

Figure 11A:
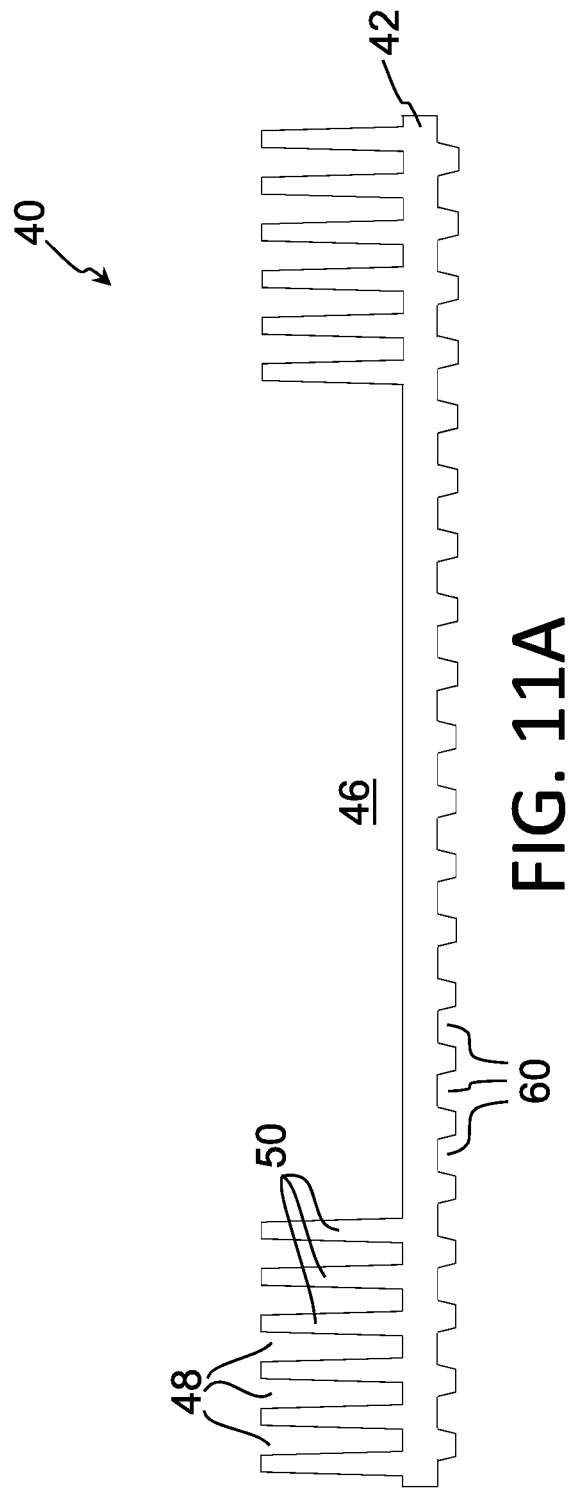

FIGS. 11A-11D illustrate the formation of an alternate embodiment of silicon heat sink 40, which contains thermal vias extending through the substrate 42 for thermally connecting recessed top and bottom surfaces of substrate 42. Starting with the structure of FIG. 8B, after removal of photo resist 44, vias 60 are formed into the bottom surface of substrate 60 in the same manner described above with respect to vias 26 are formed into the bottom surface of substrate 12. The resulting structure is shown in FIG. 11A.

Photoresist 62 is deposited on the bottom surface of substrate 42 (including in vias 60). Photoresist 62 is exposed and etched via photolithography to remove select portions of the photoresist at the apex portions of those vias 60 which are disposed underneath cavity 46, leaving selected portions of the bottom surface of substrate 42 exposed, as shown in FIG. 11B.

Figure 11D:
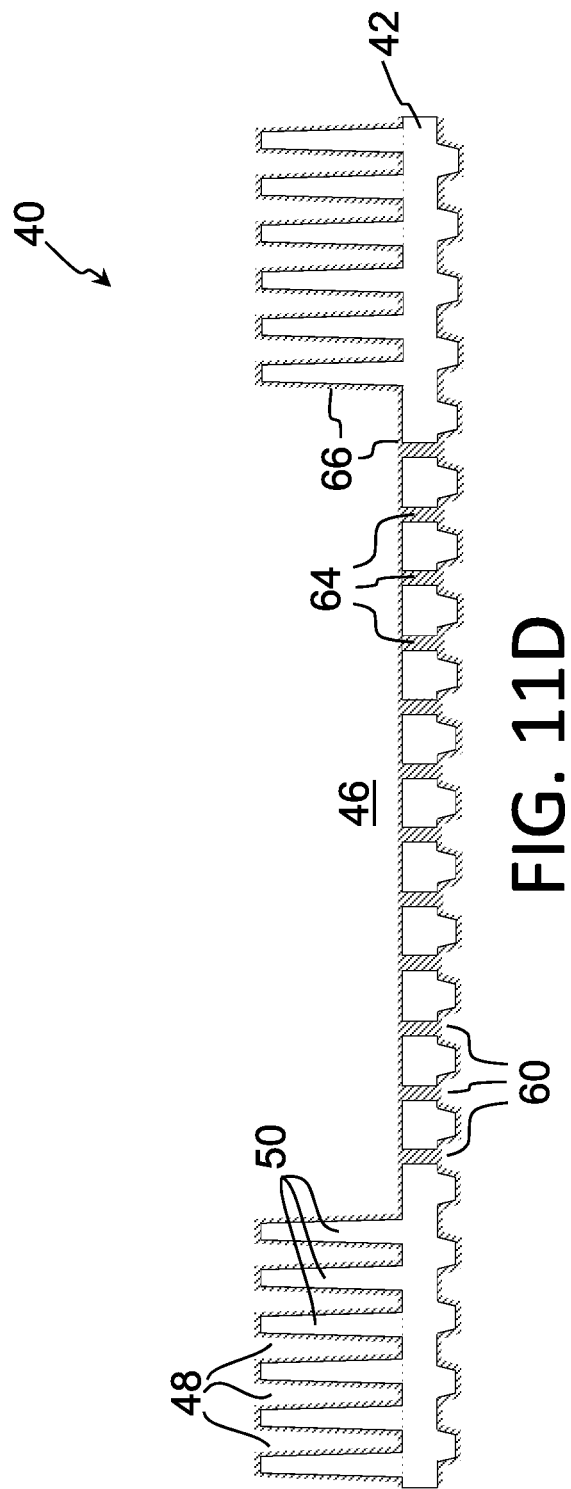

A silicon etch is then performed on the bottom surface of substrate 42 to form through-holes 64 that extend through the substrate 42 to the cavity 46. Preferably, the silicon etch is a dry etch. The through holes 64 can have vertical or tapered sidewalls. FIG. 11C shows the resulting structure (after photoresist 62 is removed). Thermal conductive layer 66 is formed over both top and bottom surfaces of substrate 42 in a similar manner as discussed above. Layer 66 lines or fills the various cavities, trenches and vias. Preferably, layer 66 lines cavity 46, trenches 48 and vias 60, and fills through holes 64, as shown in FIG. 11D. The thermal conductive material 66 in through holes 64 efficiently transfers heat from a device mounted in cavity 46, through substrate 42, and to vias 60, especially if material 66 is more thermally conductive than silicon.

Figure 12:
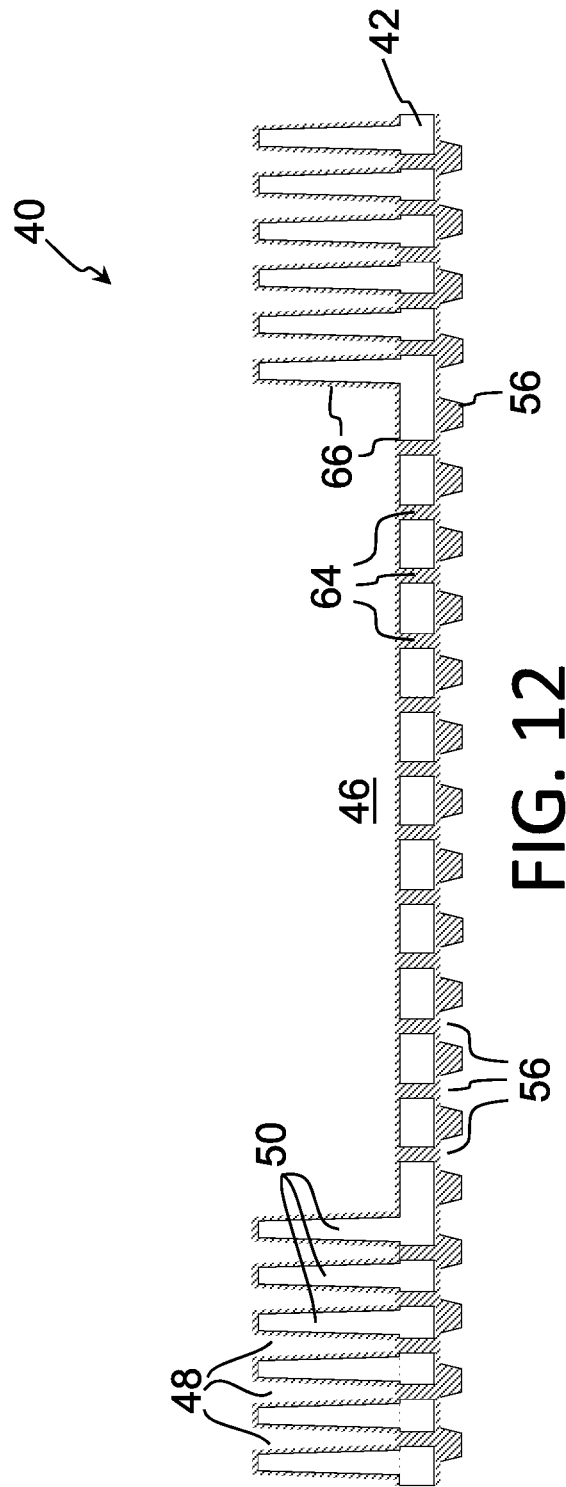
FIG. 12 is a side cross sectional view of an alternate embodiment of the heat sink with cooling features.
Figure 13:
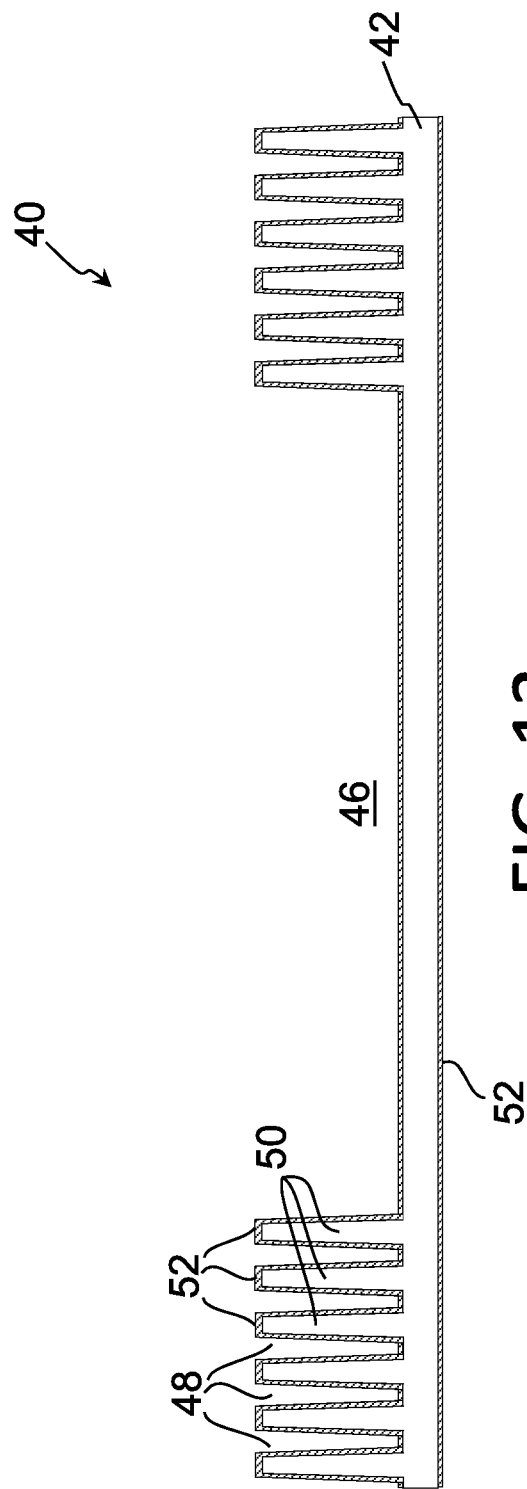
FIG. 13 is a side cross sectional view of an alternate embodiment of the heat sink with cooling features.
Figure 14:
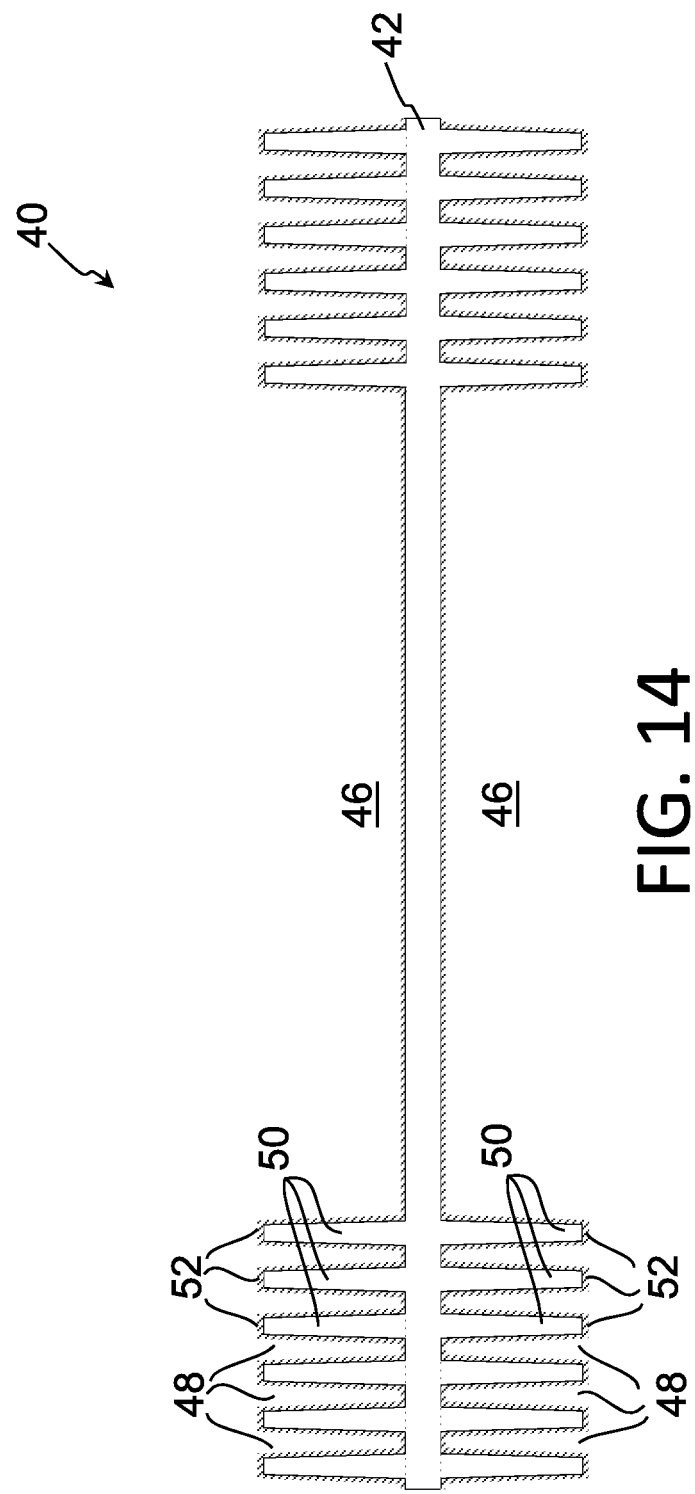
FIG. 14 is a side cross sectional view of an alternate embodiment of the heat sink with cooling features.
Figure 15:
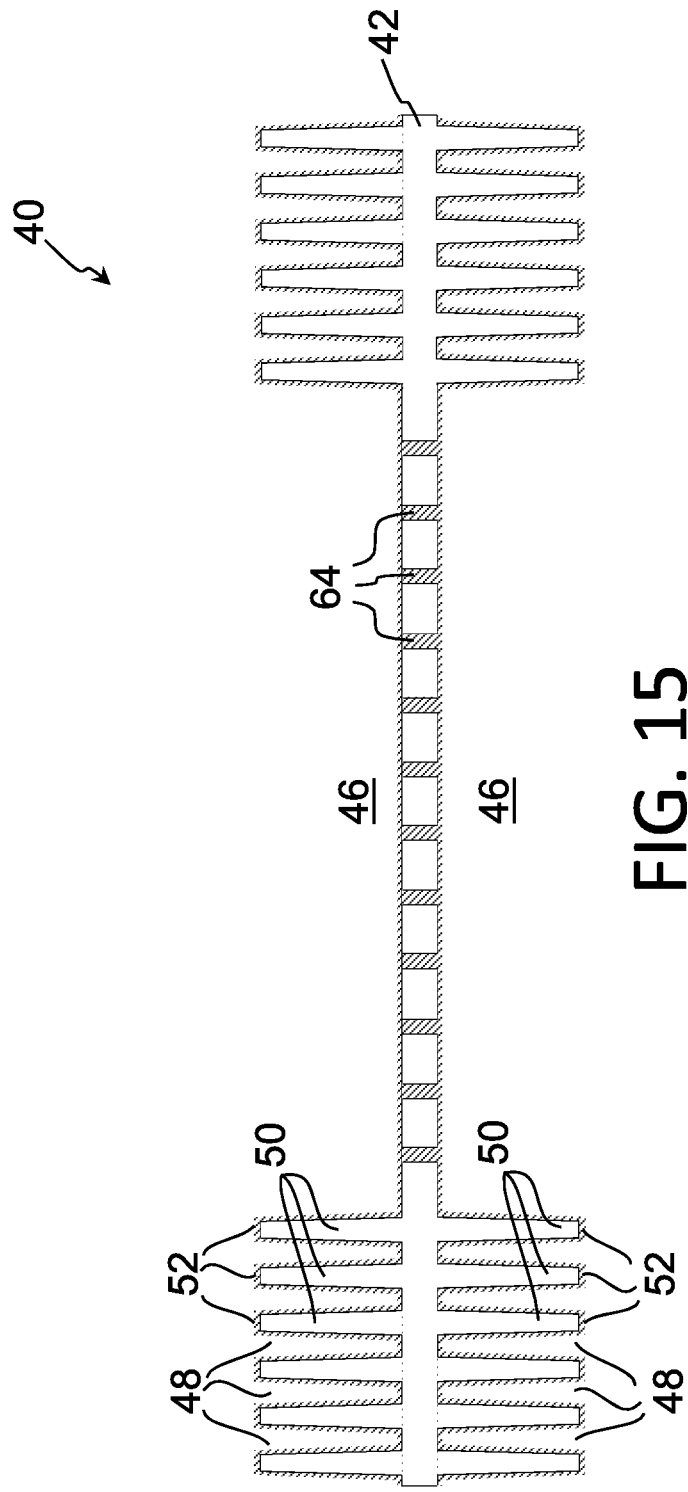
FIG. 15 is a side cross sectional view of an alternate embodiment of the heat sink with cooling features.
Figure 16:
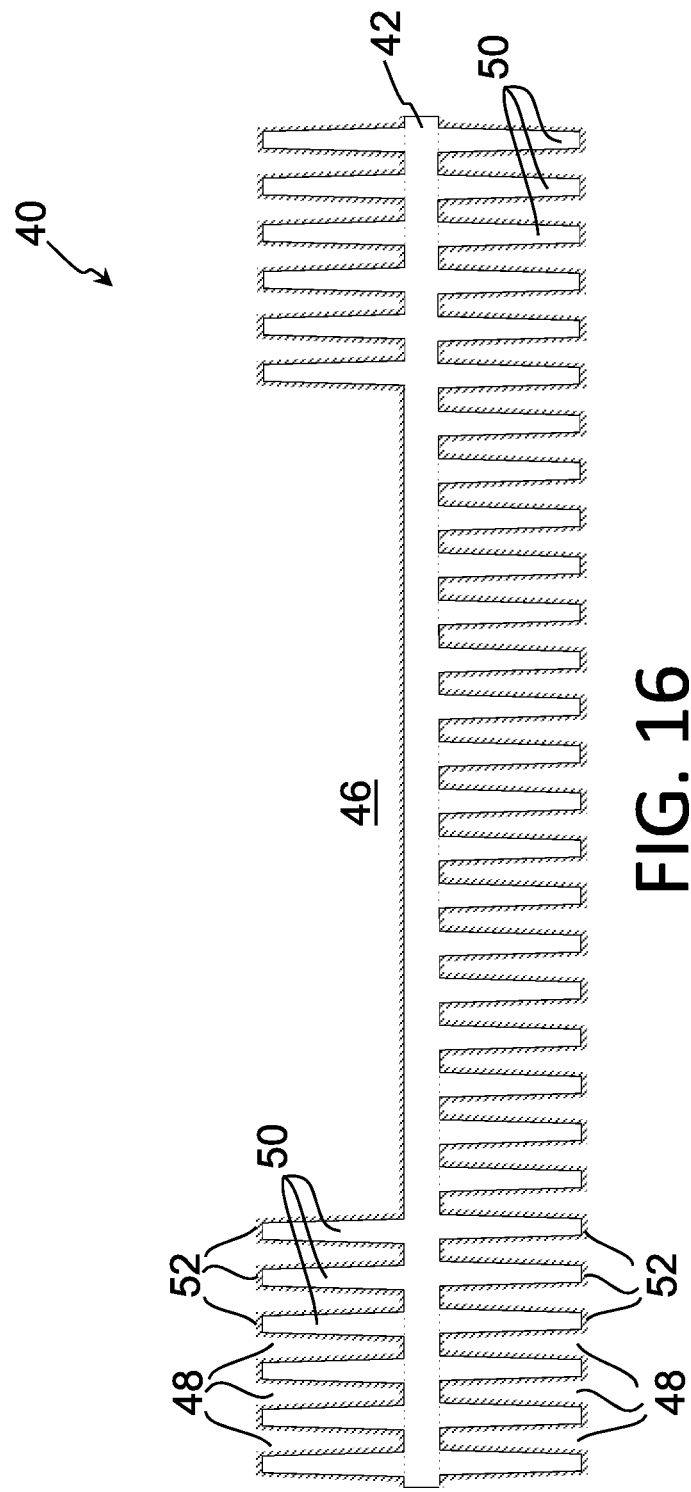
FIG. 16 is a side cross sectional view of an alternate embodiment of the heat sink with cooling features.
Figure 17:
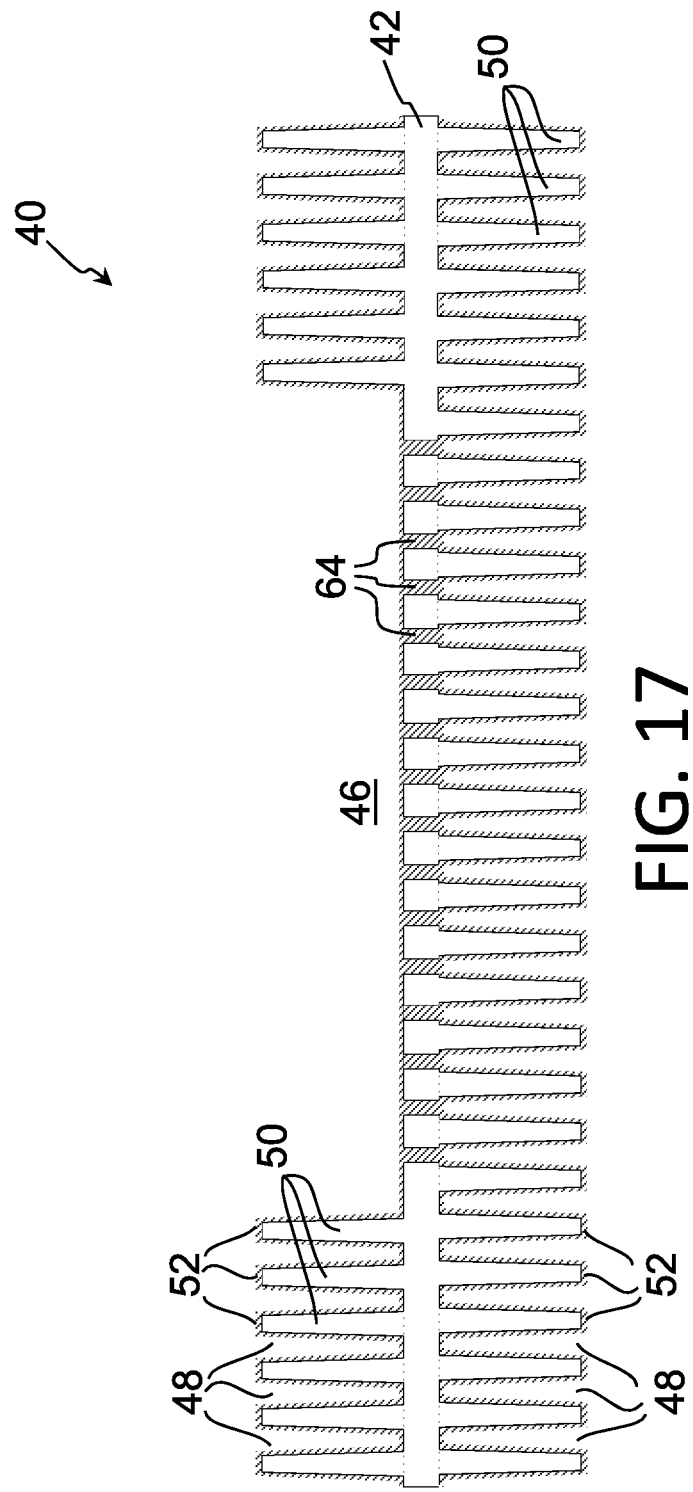
FIG. 17 is a side cross sectional view of an alternate embodiment of the heat sink with cooling features.
Figure 18:
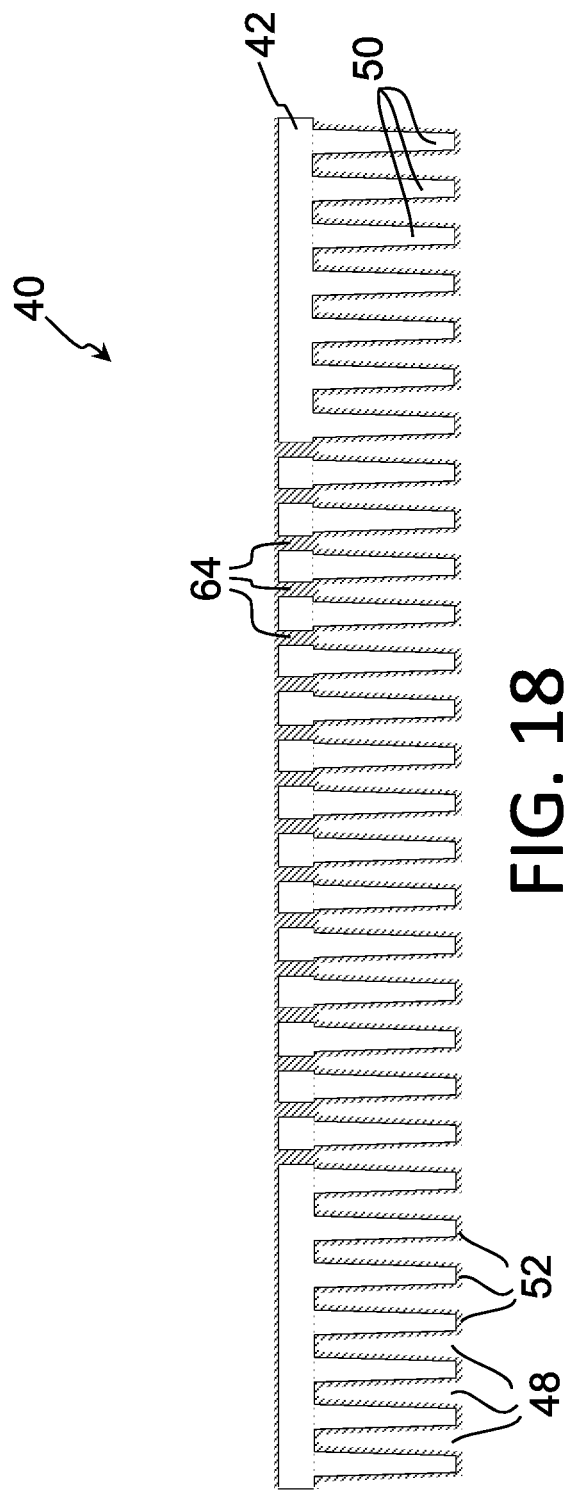
FIG. 18 is a side cross sectional view of an alternate embodiment of the heat sink with cooling features.
Figure 19:
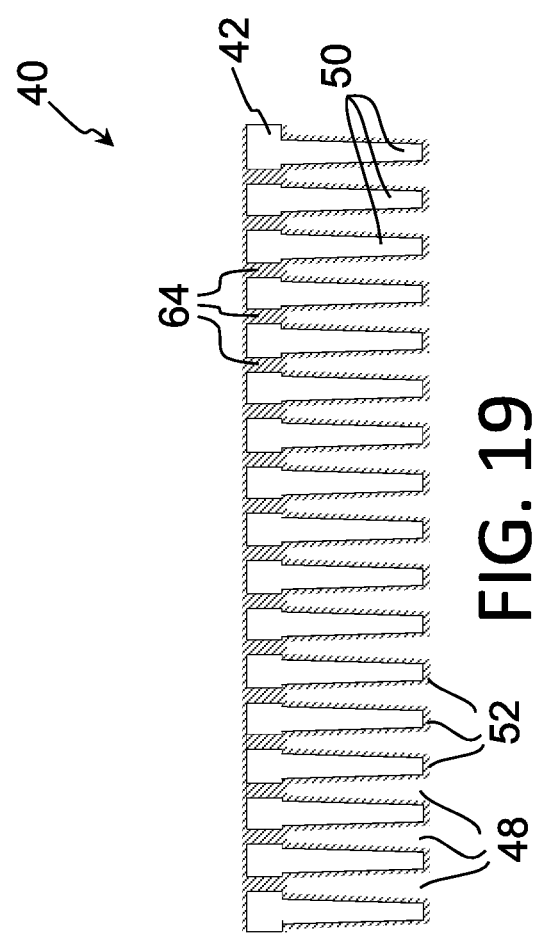
FIG. 19 is a side cross sectional view of an alternate embodiment of the heat sink with cooling features.
Figure 20:
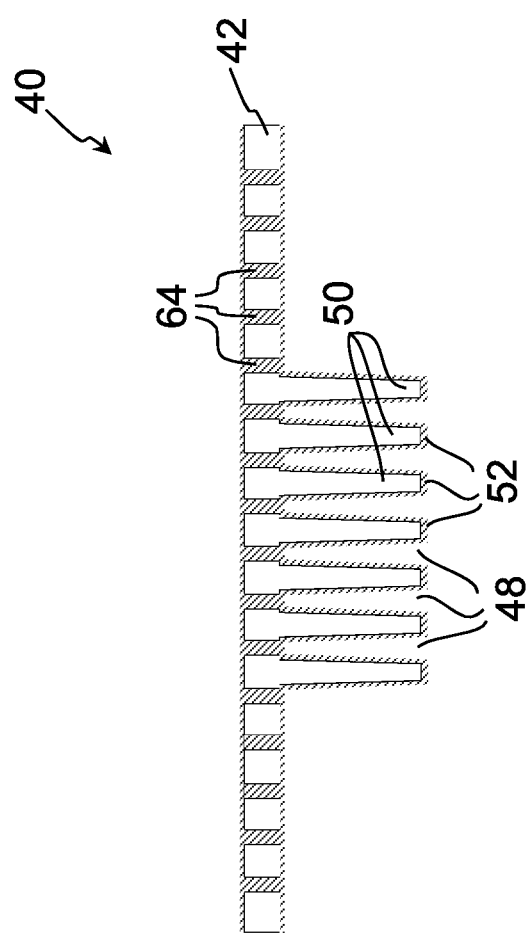
FIG. 20 is a side cross sectional view of an alternate embodiment of the heat sink with cooling features.
Figure 21:
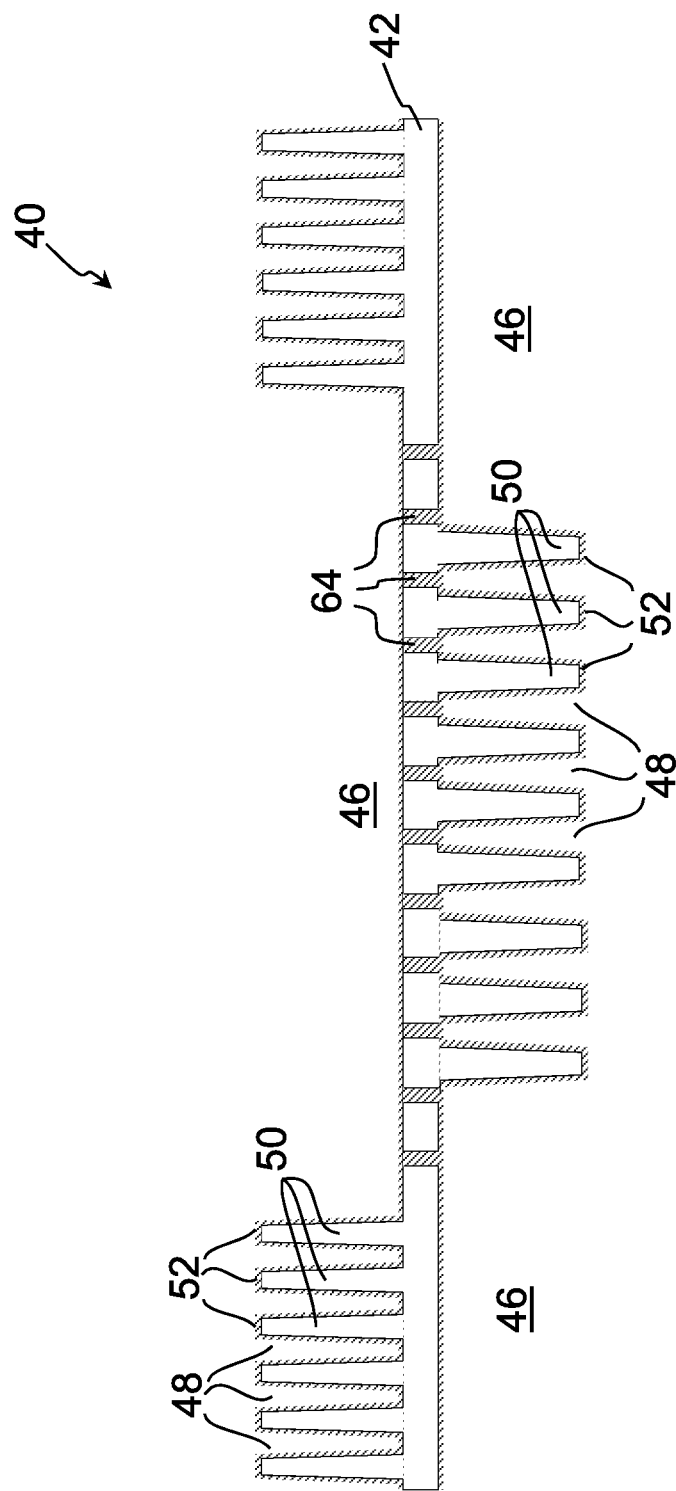
FIG. 21 is a side cross sectional view of an alternate embodiment of the heat sink with cooling features.

Other variations of heat sink 40 can be used which mix and match different features of the above described heat sinks. For example, FIG. 12 illustrates a heat sink 40 which combines the vias 58 formed in thermal conductive layer 56 on the bottom surface of substrate 42 shown in FIG. 10 with the through holes 64 filled with the thermally conductive material shown in FIG. 11D. FIG. 13 illustrates the heat sink 40 of FIG. 8C, but with the thermal conductive layer 52 also formed on the bottom surface of the substrate 42. FIG. 14 illustrates the heat sink 40 of FIG. 8C, but with the cavity 46, trenches 48 and fins 50 formed into the bottom surface of substrate 42 as well. FIG. 15 illustrates the heat sink 40 of FIG. 14, but with the through holes 64 extending through the substrate 42 and filled with the thermal conductive material 52. FIG. 16 illustrates the heat sink 40 of FIG. 14, but with additional trenches 48 and fins 50 formed into the bottom surface of the substrate 42 opposite the cavity 46 of the upper surface. FIG. 17 illustrates the heat sink 40 of FIG. 16, but with the through holes 64 extending through the substrate 42 and filled with the thermal conductive material 52 adjacent cavity 46. FIG. 18 illustrates the heat sink 40 of FIG. 17, but with no trenches 48 and fins 50 formed on the top surface of the substrate 42 (i.e. substrate has a planar top surface). FIG. 19 illustrates the heat sink 40 of FIG. 18, but with no portion of the substrate 42 that lacks through holes 64 (e.g. the size of substrate 42 can match the size of the substrate 12 mounted thereto). FIG. 20 illustrates the heat sink 40 of FIG. 19, but with trenches 48 and fins 50 formed only on a central portion of the bottom surface of substrate 42. FIG. 21 illustrates the heat sink 40 of FIG. 15, but the cavities 46 in the bottom surface of substrate 42 which are offset from the cavity 46 in the top surface of substrate 42.

The silicon based chips 10 and heat sinks 40 have many advantages. Using silicon to create the heat sink allows access to advanced etching processes, which enables the creation of miniature structures at a very high density and therefore enabling more surface area per volume of material. Also, miniaturization of heat sink features allows utilization of spaces that were not accessible or have been left untapped in prior art designs. For example, the sides of the semiconductor chip are usually empty space or covered by molding material. Using silicon as a heat sink substrate allows for the shrinking of the heat sink to chip level, and utilizes all available spaces with very high efficiency. Using the silicon substrate for heat dissipation, which allows for utilizing advanced silicon etching technologies, makes available many shapes and designs that were previously too costly or impossible to make using traditional heat sink manufacturing technologies, which unlocks advanced air flow designs for semiconductor heat sinks.

Thermal Interface Material (TIM) has an average thermal K value of around 9, and 80 at most. Grease and tape based TIM can wear out quickly and can be considered as a thermal insulator in comparison to the present invention. Solder based TIM only preforms at one quarter of the performance of present invention, and it is much thicker. The present invention provides metal to metal bonding between the semiconductor chip 10 and the silicon heat sink 40 with target thermal K values of 350 and above. By using silicon based heat sinks with silicon based semiconductor chips, varying coefficients of thermal expansion (CTE) are no longer an issue, thus allowing the semiconductor chip to be bonded directly to the heat sink without TIM and resulting in a drastic increase in thermal dissipation rates.

Semiconductor chips often overheat in particular areas or points, thereby creating a bottle neck to the computation performance of the entire chip, the mobile device and its cooling system. The present invention includes a thermal conductivity enhancement layer on the semiconductor chip to quickly carry heat away from the hot spots and thus enable higher computation performance and heat emission rates. The thermal conductivity enhancement layer is also applied to the silicon heat sink for the same purpose.

While some materials do extremely well in thermal conduction, they are not always the best for thermal emissivity (radiation heat transfer). For example, copper and silver have some of the best thermal conductivity and thermal emissivity coefficients. However, these metals will oxidize quickly which drastically lowers the emissivity performance while their thermal conductivity remains unharmed. It is preferred to protect the thermal conductivity layer from oxidization while retaining a high thermal emissivity coefficient. Therefore, any of the above described embodiments having a thermal conductive layer can include a thermal emissivity enhancement layer (e.g. nickel or gold for emissivity) formed on the thermal conductive layer (e.g. copper or silver for thermal conductivity). Below is a listing of materials that are ideal for the thermal emissivity enhancement layer:

| Material | Emissivity coefficient |
| --- | --- |
| Nickel, electroplated | 0.03 |
| Nickel, polished | 0.072 |
| Nickel, oxidized | 0.59-0.86 |
| Copper, electroplated | 0.03 |
| Copper heated and covered with thick oxide layer | 0.78 |
| Copper, polished | 0.023-0.052 |
| Copper Nickel Alloy, polished | 0.059 |
| Silver, Polished | 0.02-0.03 |
| Gold, not polished | 0.47 |
| Gold, Polished | 0.025 |

Figure 22:
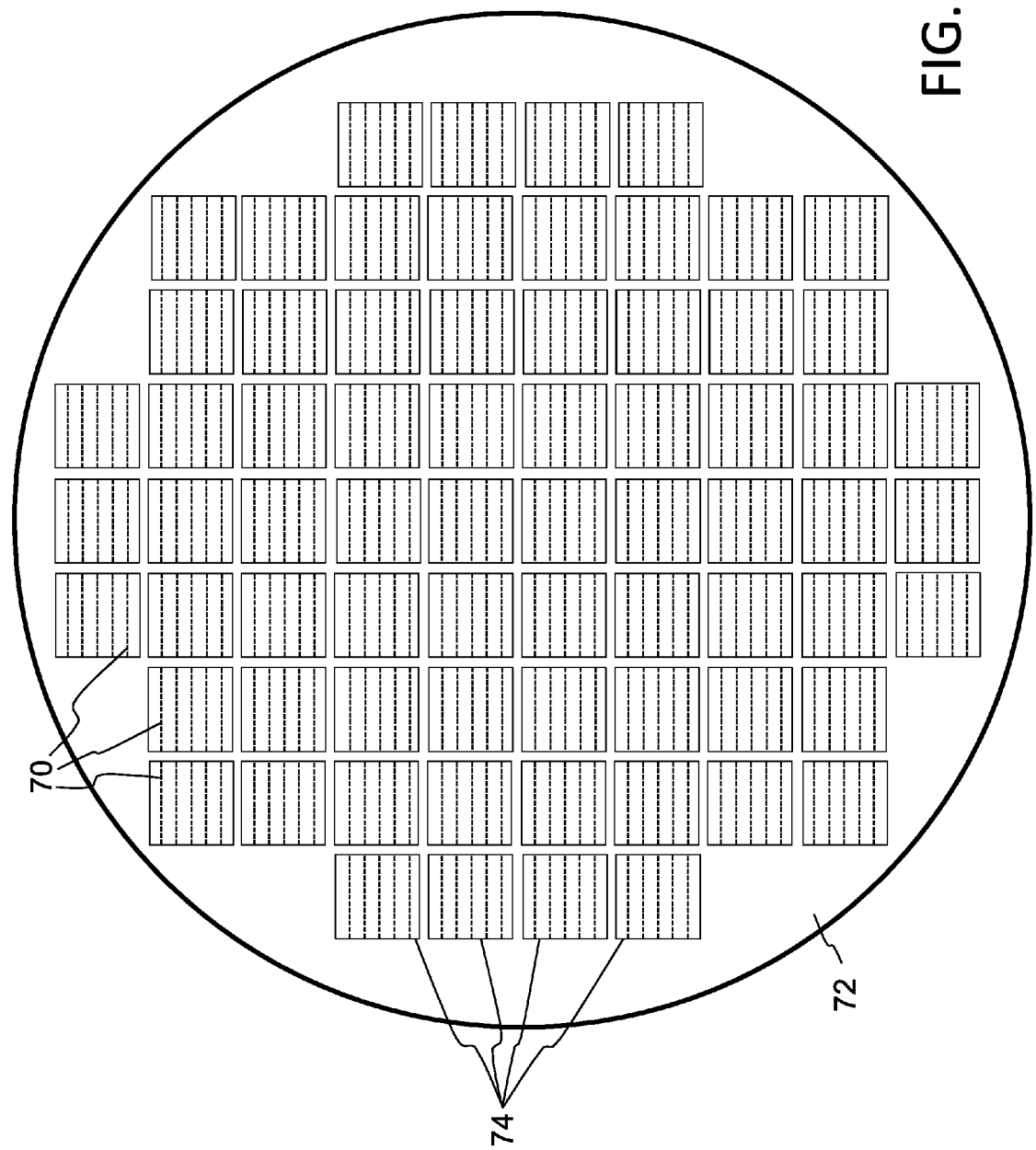
FIG. 22 is a top view of a wafer with cooling features missing between semiconductor chip devices.

When creating patterns on silicon wafers (or any other material), warpage of the silicon substrate can occur and have negative impacts on the structure. Therefore, when forming patterns of vias or trenches into substrates 12 and 42 as described above, there are several techniques that can be employed to minimize warpage of the wafer before singulation. The first technique for minimizing wafer warpage is to discontinue any vias or trenches between chips or heat sinks that are eventually singulated from each other. More specifically, those areas of the wafer where scribe lines are or will be located should be free of the vias and trenches, as shown in FIG. 22. The via/trench patterns 70 are not formed in portions of the silicon wafer 72 that are between devices 74 (e.g. chips 10, heat sinks 40, etc.).

Figure 23:
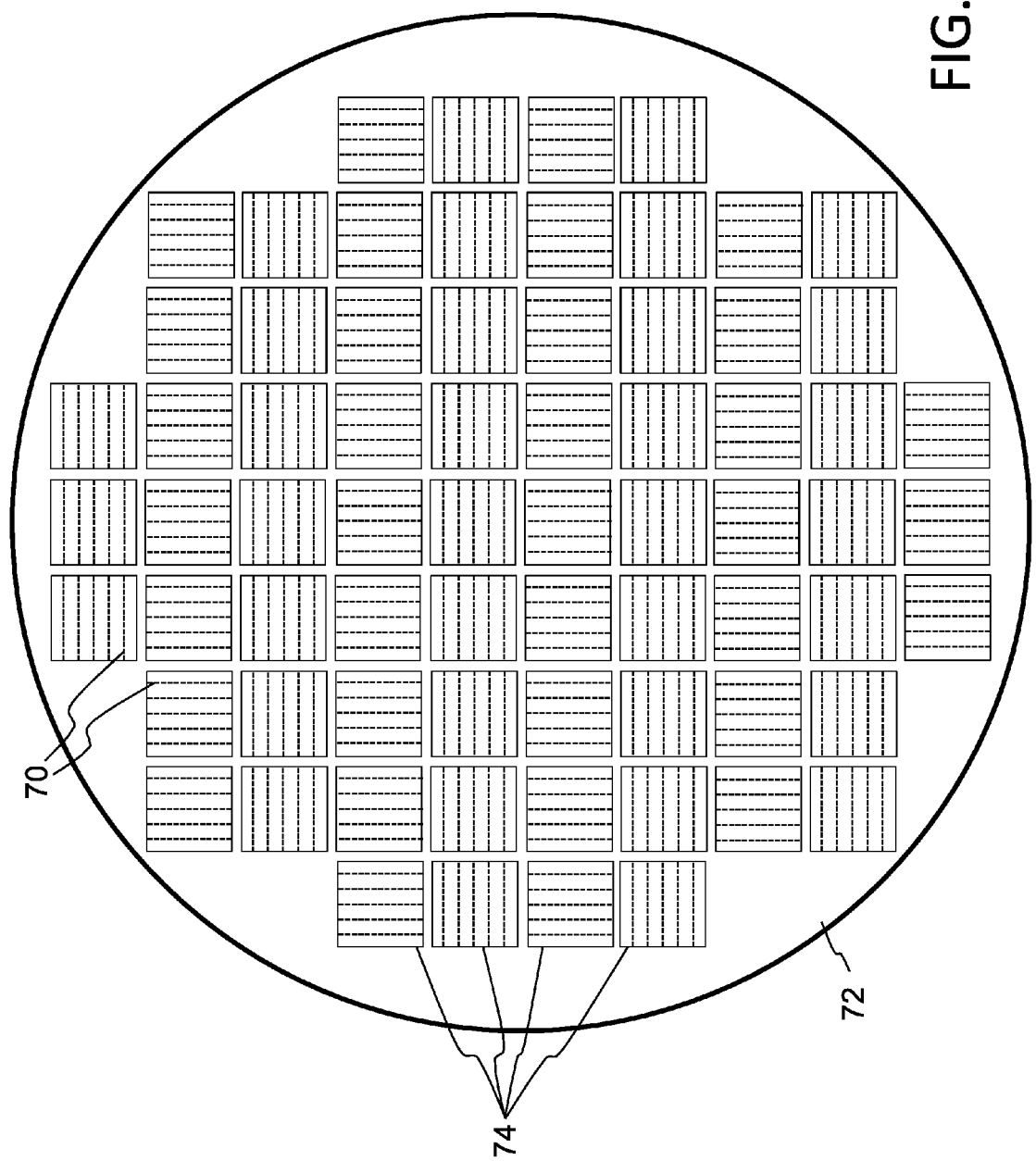
FIG. 23 is a top view of a wafer having rows of semiconductor chip devices with cooling feature patterns orthogonal to each other on a row by row basis.

A second technique for minimizing wafer warpage is to orient the via/trench pattern 70 orthogonally relative to that of the adjacent row, as shown in FIG. 23. Specifically, the via/trench pattern 70 is horizontally oriented in the first row of devices 74, is vertically oriented in the second row of devices 74, and so on.

Figure 24:
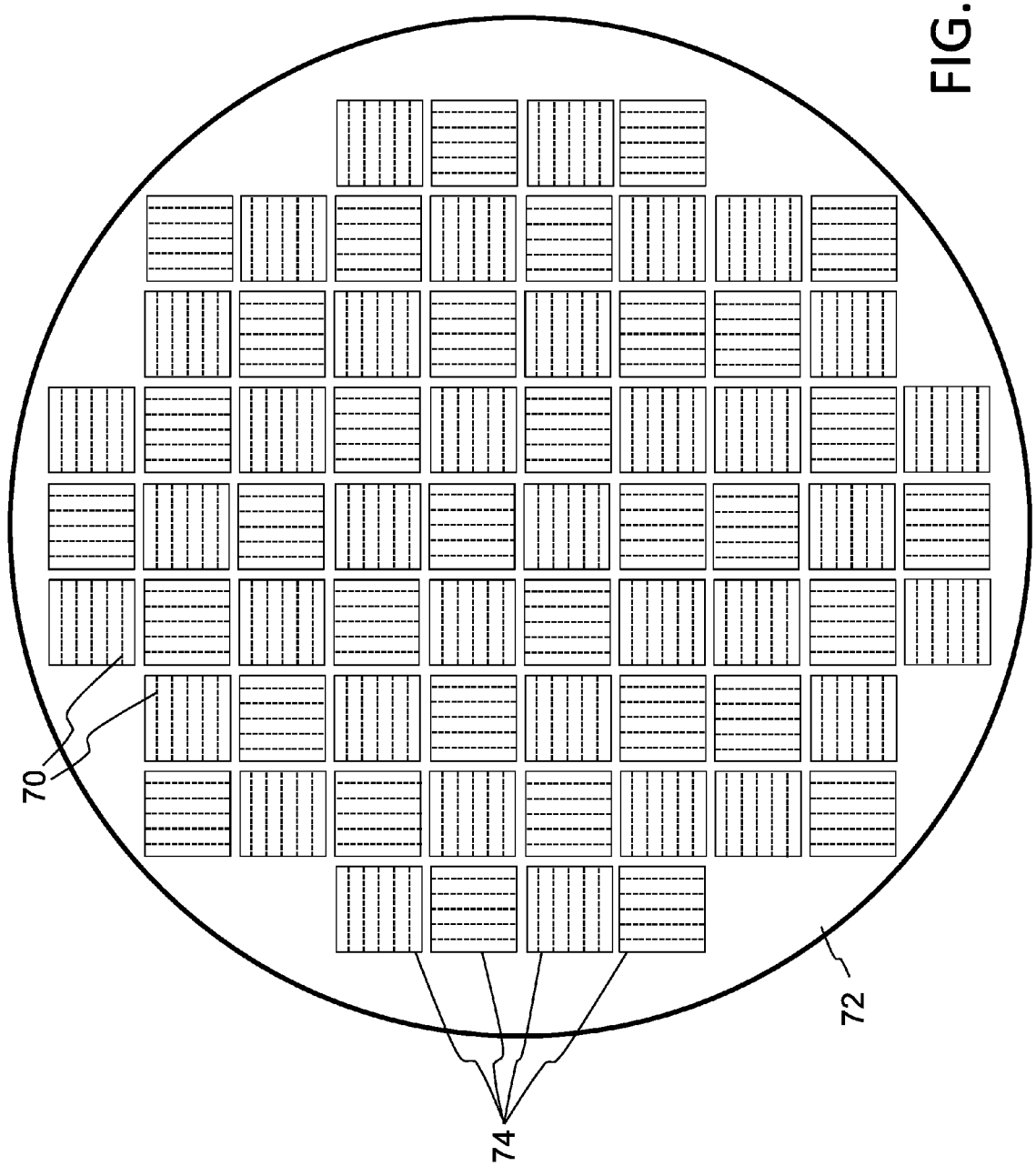
FIG. 24 is a top view of a wafer having rows of semiconductor chip devices with cooling feature patterns orthogonal to each other on a device by device basis.

A third technique for minimizing wafer warpage is to orient the via/trench pattern 70 for each device 74 orthogonally relative to that in all neighboring devices 74, as shown in FIG. 24.

Figure 25A:
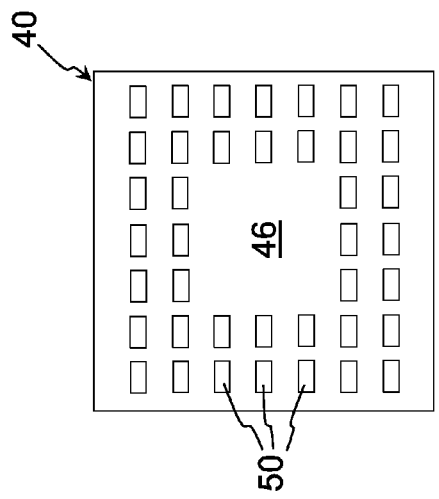
FIGS. 25A-25D are top views of the heat sinks with different cooling fin configurations.
Figure 25B:
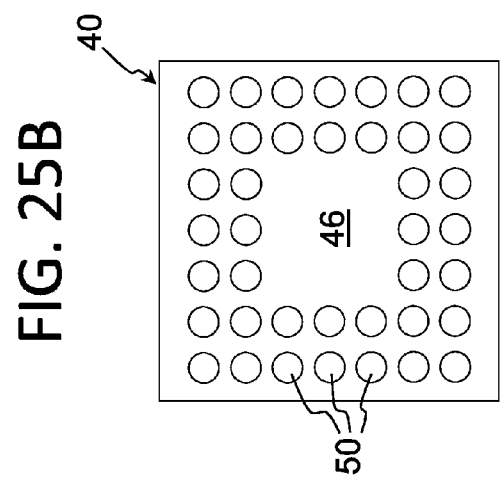
Figure 25C:
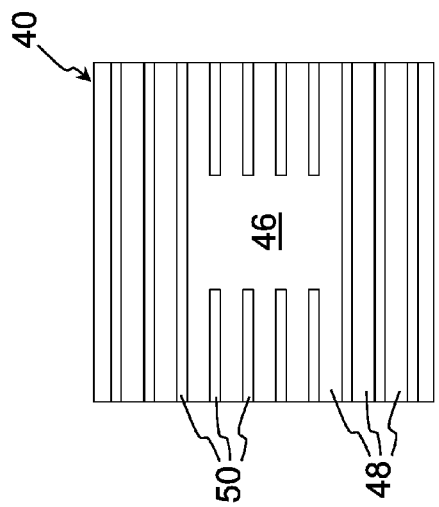
Figure 25D:
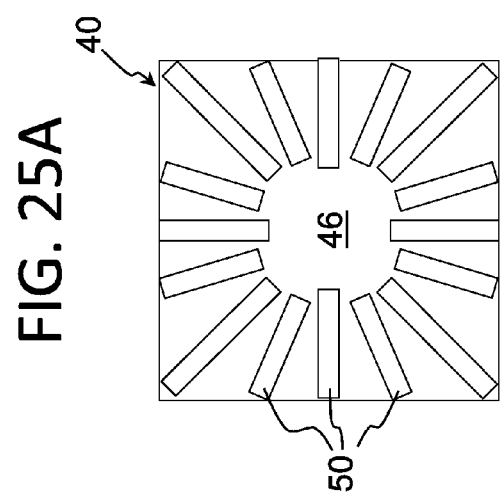

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the semiconductor chip and/or heat sink of the present invention. Single layers of material could be formed as multiple layers of such or similar materials, and vice versa. Lastly, while cooling fins 50 are shown and described as straight and parallel to each other, other fin configurations can be used to achieve the desired thermal emission. For example, FIG. 25A shows straight and parallel fins 25. However, fins 25 could be discontinuous (as shown in FIG. 25B), oriented in a non-parallel configuration such as a star configuration (as shown in FIG. 25C), or configured as round pillars (as shown in FIG. 25D).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/ elements therebetween, as well as forming the element indirectly on the substrate with one or more intermediate materials/elements therebetween.

What is claimed is:

1. A semiconductor apparatus, comprising:
   a semiconductor chip, comprising:
      a first silicon substrate with opposing first and second surfaces,
      a semiconductor device formed at or in the first surface,
      a plurality of first contact pads formed at the first surface which are electrically coupled to the semiconductor device,
      a layer of thermal conductive material on the second surface, and
      a plurality of first vias formed partially through the layer of thermal conductive material; and
   a heat sink that includes:
      a second silicon substrate with opposing first and second surfaces,
      a plurality of second vias formed into one of the first and second surfaces defining first fins of the second silicon substrate between the second vias,
      a layer of thermal conductive material in the second vias,
      wherein the second surface of the first silicon substrate is mounted to the first surface of the second silicon substrate.

2. The semiconductor apparatus of claim 1, wherein the plurality of second vias is formed into the first surface of the second silicon substrate.

3. The semiconductor apparatus of claim 2, further comprising:
   a cavity formed into the first surface of the second substrate, wherein the semiconductor chip is disposed in the cavity.

4. The semiconductor apparatus of claim 3, wherein the layer of thermal conductive material extends into the cavity.

5. The semiconductor apparatus of claim 2, further comprising:
   a plurality of third vias formed into the second surface of the second silicon substrate; and
   a second layer of thermal conductive material in the third vias.

6. The semiconductor apparatus of claim 2, further comprising:
   a second layer of thermal conductive material on the second surface of the second silicon substrate; and
   a plurality of third vias formed partially through the second layer of thermal conductive material.

7. The semiconductor apparatus of claim 5, further comprising:
   a plurality of through holes each extending between the first and second surfaces of the second substrate and each lined or filled with thermal conductive material.

8. The semiconductor apparatus of claim 7, wherein each of the through holes is aligned with one of the third vias.

9. The semiconductor apparatus of claim 6, further comprising:
   a plurality of through holes each extending between the first and second surfaces of the second substrate and each lined or filled with thermal conductive material.

10. The semiconductor apparatus of claim 7, wherein each of the through holes is aligned with one of the third vias.

11. The semiconductor apparatus of claim 3, further comprising:
   a plurality of third vias formed into the second surface of the second silicon substrate defining second fins of the second silicon substrate between the third vias.

12. The semiconductor apparatus of claim 11, further comprising:
   a second cavity formed into the second surface of the second substrate.

13. The semiconductor apparatus of claim 1, wherein each of the fins of the second silicon substrate is elongated and extending parallel to the others of the fins.

14. The semiconductor apparatus of claim 1, wherein each of the fins of the second silicon substrate is elongated and extending away from a central portion of the second substrate.

15. The semiconductor apparatus of claim 1, wherein each of the fins of the second silicon substrate is a pillar.

* * * * *